(12) United States Patent
Chai

(10) Patent No.: US 11,335,420 B2
(45) Date of Patent: May 17, 2022

(54) MEMORY DEVICE FOR FORMING NARROW THRESHOLD VOLTAGE DISTRIBUTION AND OPERATING METHOD THEREOF

(71) Applicant: SK hynix Inc., Gyeonggi-do (KR)

(72) Inventor: Soo Yeol Chai, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 16/915,527

(22) Filed: Jun. 29, 2020

(65) Prior Publication Data

US 2021/0193238 A1 Jun. 24, 2021

(30) Foreign Application Priority Data

Dec. 23, 2019 (KR) .................. 10-2019-0173264

(51) Int. Cl.
*G11C 16/34* (2006.01)
*G11C 16/04* (2006.01)
*G11C 16/24* (2006.01)
*G11C 16/10* (2006.01)
*G11C 16/08* (2006.01)

(52) U.S. Cl.
CPC ...... *G11C 16/3459* (2013.01); *G11C 16/0483* (2013.01); *G11C 16/08* (2013.01); *G11C 16/10* (2013.01); *G11C 16/24* (2013.01)

(58) Field of Classification Search
CPC . G11C 16/3459; G11C 16/0483; G11C 16/24; G11C 16/10; G11C 16/08; G11C 2211/5621; G11C 11/5628; G11C 2211/5642
See application file for complete search history.

(56) References Cited

U.S. PATENT DOCUMENTS

| | | | |
|---|---|---|---|
| 2011/0299341 A1* | 12/2011 | Lim | G11C 11/5628 365/185.24 |
| 2019/0156896 A1* | 5/2019 | Park | G11C 16/3445 |
| 2020/0051649 A1* | 2/2020 | Her | G11C 16/30 |
| 2020/0111535 A1* | 4/2020 | Han | G11C 16/08 |

FOREIGN PATENT DOCUMENTS

| | | |
|---|---|---|
| KR | 10-2014-0144990 | 12/2014 |
| KR | 10-2016-0052277 | 5/2016 |

* cited by examiner

*Primary Examiner* — Connie C Yoha
(74) *Attorney, Agent, or Firm* — IP & T Group LLP

(57) ABSTRACT

There are provided a memory device and an operating method thereof. The memory device includes memory cells connected between a bit line and a source line, a voltage generator for generating program voltages and verify voltages which are to be applied to a selected word line connected to a selected memory cell, a page buffer for storing data respectively sensed in verify operations using the verify voltages, and for transferring a program allow voltage, a program inhibit voltage or a program control voltage to the bit line by sequentially using the data, and a logic circuit for generating page buffer control signals for controlling the page buffer.

20 Claims, 12 Drawing Sheets

MEMORY DEVICE FOR FORMING NARROW THRESHOLD VOLTAGE DISTRIBUTION AND OPERATING METHOD THEREOF

CROSS-REFERENCE TO RELATED APPLICATION

The present application claims priority under 35 U.S.C. § 119(a) to Korean patent application number 10-2019-0173264, filed on Dec. 23, 2019, which is incorporated herein by reference in its entirety.

BACKGROUND

Field of Invention

Various embodiments of the present disclosure generally relate to a memory device and an operating method thereof, and more particularly, to a memory device capable of performing a program operation and an operating method of the memory device.

Description of Related Art

A memory device may include a plurality of memory cells in which data is stored. The memory cells may be implemented as volatile memory cells in which stored data disappears when the supply of power is interrupted, or be implemented as nonvolatile memory cells in which stored data is retained even when the supply of power is interrupted.

Recently, as portable electronic devices are increasingly used, memory devices configured with nonvolatile memory cells have been increasingly used. Due to miniaturization of electronic devices, the high integration and large capacity of memory devices used in the electronic devices are required.

Memory devices were implemented in a two-dimensional structure in which memory cells were arranged in a horizontal direction with respect to a substrate. However, memory devices have recently been implemented in a three-dimensional structure in which memory cells are stacked in a vertical direction from a substrate so as to achieve high integration and large capacity.

In addition, as a number of bits stored in one memory cell is gradually increased, a number of program states which memory cells may have is also increased gradually. The number of program states may be in proportion to a number of sections in which threshold voltages are distributed.

SUMMARY

Embodiments provide a memory device capable of narrowing the width of a threshold voltage distribution of memory cells, and an operating method of the memory device.

In accordance with an aspect of the present disclosure, there is provided a memory device including: memory cells connected between a bit line and a source line; a voltage generator configured to generate program voltages and verify voltages, which are to be applied to a selected word line connected to a selected memory cell; a page buffer configured to store data respectively sensed in verify operations using the verify voltages, and transfer a program allow voltage, a program inhibit voltage or a program control voltage to the bit line by sequentially using the data; and a logic circuit configured to generate page buffer control signals for controlling the page buffer.

In accordance with another aspect of the present disclosure, there is provided a method for operating a memory device, the method including: performing verify operations on a memory cell using a plurality of verify voltages to store data respectively sensed in the verify operations in a plurality of input latches of a page buffer, respectively; applying a program voltage to a selected word line connected to the memory cell; and sequentially transmitting, while the program voltage is applied, the data stored in the plurality of input latches to an output latch of the page buffer with a time difference, and applying a program allow voltage, a program inhibit voltage or a program control voltage to a bit line connected to the memory cell by using the data sequentially transmitted to the output latch.

In accordance with still another aspect of the present disclosure, there is provided a method for operating a memory device, the method including: programming a memory cell to increase a threshold voltage of the memory cell to a target voltage; verifying the memory cell by using a plurality of verify voltages; and performing a program operation by controlling a voltage applied to a bit line connected to the memory cell until the threshold voltage of the verified memory cell is increased up to the target voltage, wherein, to control the voltage applied to the bit line, a time for which data sensed in a verify operation using the plurality of verify voltages are reflected to the bit line is controlled, and a level of a page sensing signal applied to a switch which connects the bit line and a page buffer is sequentially controlled.

In accordance with still another aspect of the present disclosure, there is provided a method for operating a memory device, the method including: programming a memory cell to increase a threshold voltage of the memory cell to a target voltage; verifying the memory cell by using a plurality of verify voltages; and performing a program operation by controlling a voltage applied to a bit line connected to the memory cell until the threshold voltage of the verified memory cell is increased up to the target voltage, wherein, to control the voltage applied to the bit line, a time for which data sensed in a verify operation using the plurality of verify voltages are reflected to the bit line is controlled, and a level of a page sensing signal applied to a switch which connects the bit line and a page buffer is varied depending on the controlled time.

BRIEF DESCRIPTION OF THE DRAWINGS

Example embodiments will now be described more fully hereinafter with reference to the accompanying drawings; however, the examples may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
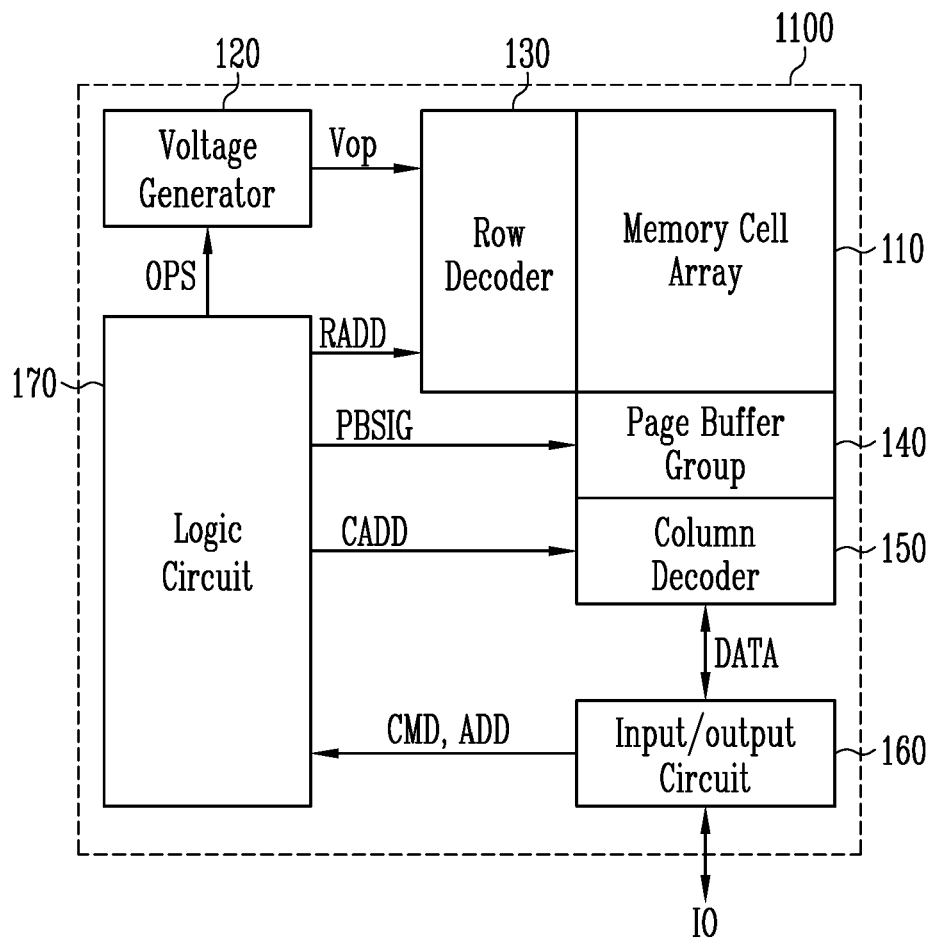
FIG. 1 is a diagram illustrating a memory device in accordance with an embodiment of the present disclosure.

FIG. 1 is a diagram illustrating a memory device 1100 in accordance with an embodiment of the present disclosure.

Referring to FIG. 1, the memory device 1100 may include a memory cell array 110 configured to store data, peripheral circuits 120 to 160 configured to perform a program, read or erase operation, and a control logic 170 configured to control the peripheral circuits 120 to 160.

The memory cell array 110 may include a plurality of memory blocks for storing data. Each of the memory blocks may include a plurality of memory cells, and the memory cells may be implemented in a two-dimensional structure in which the memory cells are arranged horizontally to a substrate or a three-dimensional structure in which the memory cells are stacked in a vertical direction perpendicular to a substrate.

The peripheral circuits 120 to 160 may include a voltage generator 120, a row decoder 130, a page buffer group 140, a column decoder 150, and an input/output circuit 160.

The voltage generator 120 may generate operating voltages Vop used for various operations in response to operation signals OPS. For example, the voltage generator 120 may generate a program voltage, a verify voltage, a read voltage, a pass voltage, an erase voltage, and the like.

The row decoder 130 may select one memory block among the memory blocks included in the memory cell array 110 according to a row address RADD, and transmit operating voltages Vop to the selected memory block.

The page buffer group 140 may be connected to the memory cell array 110 through bit lines. For example, the page buffer group 140 may include page buffers connected to the respective bit lines. The page buffers may simultaneously operate in response to page buffer control signals PBSIG, and temporarily store data during a program or read operation. To this end, each of the page buffers may include a plurality of latches for temporarily storing data. A number of latches may be changed depending on a program method. For example, the page buffers may be differently designed depending on a number of bits to be stored in one memory cell, and be differently described depending on a number of verify voltages used in a verify operation. In addition, the verify voltages may be used to determine various threshold voltages of a memory cell to be programmed to the same target voltage.

The column decoder 150 may transmit data DATA between the input/output circuit 160 and the page buffer group 140 according to a column address CADD.

The input/output circuit 160 may be connected to the controller 1200 through input/output lines JO. The input/output circuit 160 may input/output a command CMD, an address ADD, and data DATA through the input/output lines JO. For example, the input/output circuit 160 may transmit the command CMD and the address ADD, which are received through the input/output lines JO, to the logic circuit 170, and transmit the data DATA received through the input/output lines JO to the column decoder 160. The input/output circuit 160 may output data DATA received from the column decoder 150 to an external device through the input/output lines JO.

For example, the command CMD and the address ADD, which are received from the controller 1200, may be transmitted to the logic circuit 170 through the input/output circuit 160, and the data DATA received from the controller 1200 may be transmitted to the column decoder 150. In addition, data read from the memory cell array 110 in a read operation may be output to the controller 1200 through the input/output circuit 160.

The logic circuit 170 may output the operation signals OPS, the row address RADD, the page buffer control signals PBSIG, and the column address CADD, in response to the command CMD and the address ADD. For example, various signals for simultaneously operating the page buffers included in the page buffer group 140 may be included in the page buffer control signals PBSIG, and the logic circuit 170 may control the voltage level, activation time, and inactivation time of each of the various signals included in the page buffer control signals PBSIG.

Figure 2:
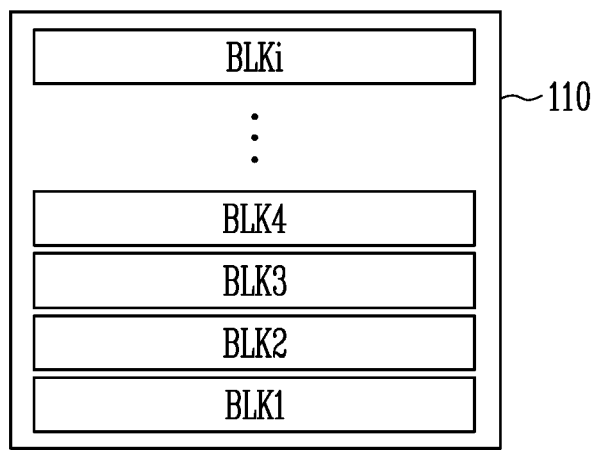
FIG. 2 is a detailed diagram of a memory cell array shown in FIG. 1.

FIG. 2 is a detailed diagram of the memory cell array 110 shown in FIG. 1.

Referring to FIG. 2, the memory cell array 110 may include first to i-th memory blocks BLK1 to BLKi, where 'i' is a positive integer. When the memory cell array 110 is implemented in a single plane structure, the memory cell array 110 may include the first to i-th memory blocks BLK1 to BLKi arranged in a first direction. When the memory cell array 110 is implemented in a multi-plane structure, the memory cell array 110 may include planes arranged in a second direction perpendicular to the first direction, and each of the planes may include the first to i-th memory blocks BLK1 to BLKi arranged in the first direction.

The first to i-th memory blocks BLK1 to BLKi may be configured identically to one another, and therefore, the i-th memory block BLKi among the memory blocks BLK1 to BLKi will be described in detail as an embodiment.

Figure 3:
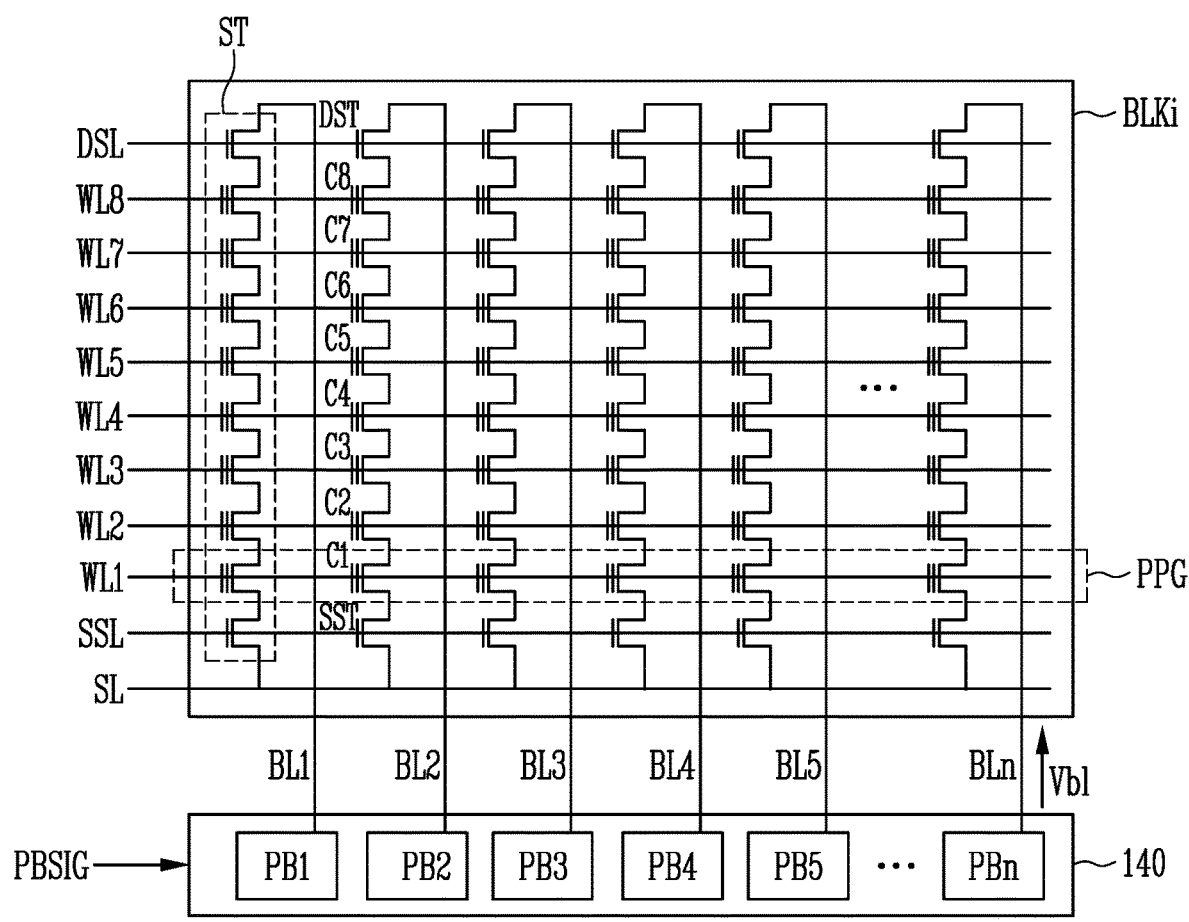
FIG. 3 is a detailed diagram of a memory block and a page buffer group shown in FIG. 1.

FIG. 3 is a detailed diagram of the memory block BLKi and the page buffer group 140.

Referring to FIG. 3, the i-th memory block BLKi may include a plurality of strings ST connected between first to n-th bit lines BL1 to BLn, where 'n' is a positive integer, and a source line SL. Each of the strings ST may include a source select transistor SST, first to eighth memory cells C1 to C8, and a drain select transistor DST, which are connected in series between the source line and each of the first to n-th bit lines BL1 to BLn. That is, one string ST may be connected between one bit line (e.g., BL1) and the source line SL, and include a source select transistor SST, first to eighth memory cells C1 to C8, and a drain select transistor DST, which are connected in series to each other.

The i-th memory block BLKi shown in FIG. 3 is a diagram illustrating a configuration of the memory block. However, the number of the source select transistor SST, the first to eighth memory cells C1 to C8, and the drain select transistor DST is not limited to that shown in FIG. 3.

Gates of source select transistors SST connected to different strings ST may be connected to a source select line SSL, gates of first to eighth memory cells C1 to C8 connected to different strings ST may be respectively connected to first to eighth word lines WL1 to WL8, and gates of drain select transistors DST connected to different strings ST may be connected to a drain select lines DSL.

Memory cells which are connected to the same word line and are included in different strings ST may constitute one physical page PPG. The memory cells may be programmed or read in a unit of a physical page PPG.

The first to n-th bit lines BL1 to BLn may be respectively connected to first to n-th page buffers PB1 to PBn included in the page buffer 140.

The first to n-th page buffers PB1 to PBn may simultaneously operate in response to the page buffer control signals PBSIG. In a program operation, the first to n-th page buffers PB1 to PBn may apply various bit line voltages Vb1 to each of the first to n-th bit lines BL1 to BLn in response to the page buffer control signals PBSIG. For example, the bit line voltage Vb1 may include a program allow voltage, a program inhibit voltage, or a program control voltage. The program allow voltage may be 0V, and the program inhibit voltage may a power supply voltage VCC. The program control voltage may vary depending on an operation of the first to n-th page buffers PB1 to PBn.

The first to n-th page buffers PB1 to PBn may be configured identically to one another, and therefore, the n-th page buffer PBn among the page buffers PB1 to PBn will be described as an example.

Figure 4:
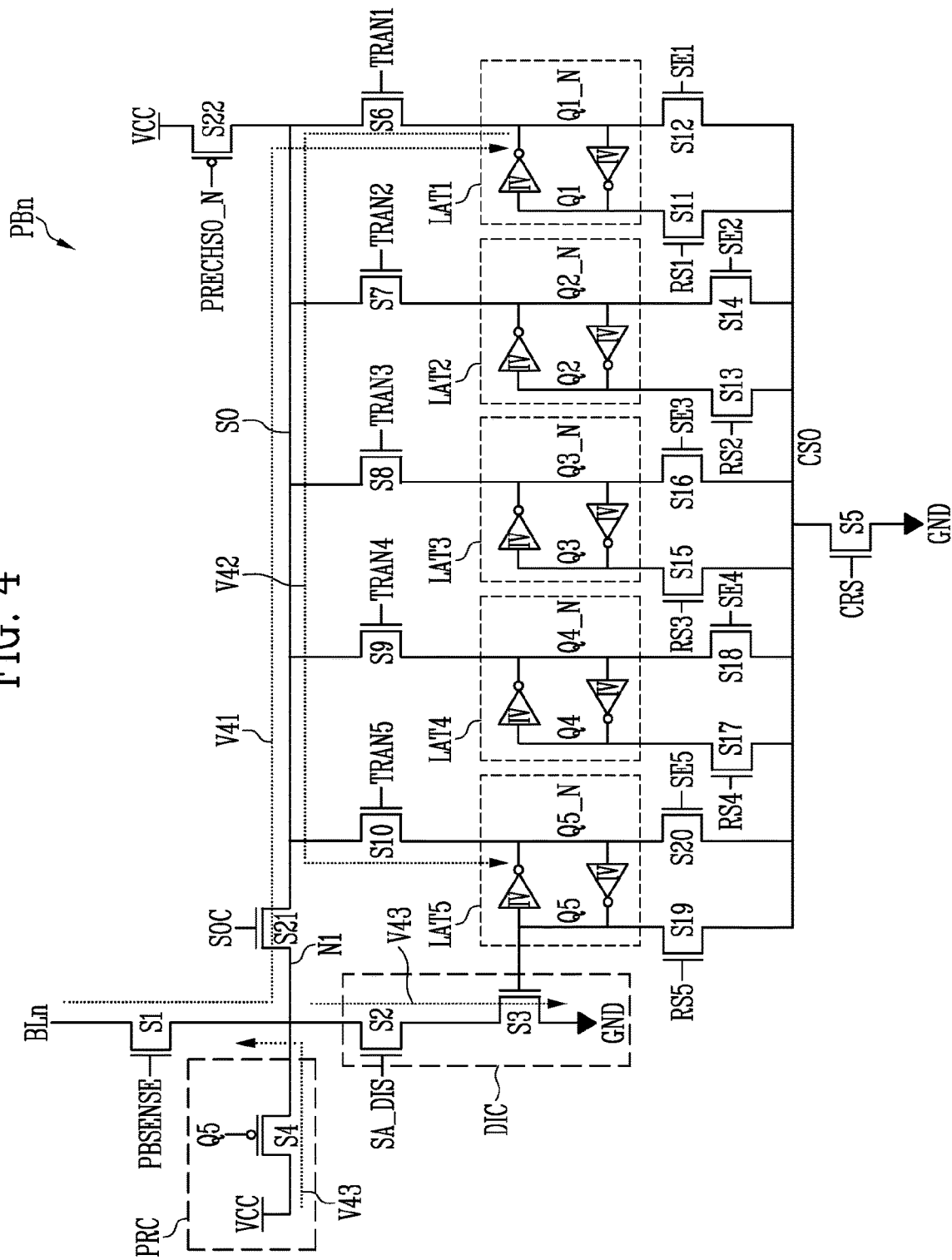
FIG. 4 is a detailed diagram of a page buffer shown in FIG. 3.

FIG. 4 is a detailed diagram of the page buffer PBn shown in FIG. 3.

Referring to FIG. 4, the n-th page buffer PBn may include a plurality of latches LAT1 to LAT5 which store data and a plurality of switches S1 to S22 which operate in response to the page buffer control signals (PBSIG shown in FIG. 3).

A first switch S1 may be connected between the n-th bit line BLn and a node N1, and include an NMOS transistor controlled in response to a page sensing signal PBSENSE. The page sensing signal PBSENSE may be output as various voltages from the logic circuit (170 shown in FIG. 1), and a turn-on level of the first switch S1 may vary depending on a voltage level of the page sensing signal PBSENSE. Therefore, a voltage of the n-th bit line BLn may be controlled according to the turn-on level of the first switch S1.

Second and third switches S2 and S3 may include NMOS transistors connected in series between the node N1 and a ground terminal GND. The second switch S2 may be turned on or turned off in response to a discharge signal SA_DIS, and the third switch S3 may be turned on or turned off according to data stored in a fifth latch LAT5. For example, when both the second and third switches S2 and S3 are turned on, the node N1 may be discharged (refer to V43).

A fourth switch S4 may be connected between a terminal to which a power supply voltage VCC is applied and the node N1, and include a PMOS transistor controlled according to the data stored in the fifth latch LAT5. For example, when the fourth switch S4 is turned on in a state in which both the second and third switches S2 and S3 are turned off or in a state in which only one of the second and third switches S2 and S3 is turned off, the node N1 may be precharged to a level of the power supply voltage VCC (refer to V44).

A fifth switch S5 may be connected between first to fifth latches LAT1 to LAT5 and the ground terminal GND, and include an NMOS transistor controlled in response to a common reset signal CRS.

Sixth to tenth switches S6 to S10 may be respectively connected between the first to fifth latches LAT1 to LAT5 and a sensing node SO, and include NMOS transistors which are turned on or turned off in response to first to fifth transmission signals TRAN1 to TRAN5. For example, the sixth switch S6 may connect the first latch LAT1 and the sensing node SO or interrupt the connection between the first latch LAT1 and the sensing node SO in response to the first transmission signal TRAN1. The seventh switch S7 may connect the second latch LAT2 and the sensing node SO or interrupt the connection between the second latch LAT2 and the sensing node SO in response to the second transmission signal TRAN2. The eighth switch S8 may connect the third latch LAT3 and the sensing node SO or interrupt the connection between the third latch LAT3 and the sensing node SO in response to the third transmission signal TRAN3. The ninth switch S9 may connect the fourth latch LAT4 and the sensing node SO or interrupt the connection between the fourth latch LAT4 and the sensing node SO in response to the fourth transmission signal TRAN4. The tenth switch S10 may connect the fifth latch LAT5 and the sensing node SO or interrupt the connection between the fifth latch LAT5 and the sensing node SO in response to the fifth transmission signal TRAN5. For example, when the seventh to tenth switches S7 to S10 are turned off and only the sixth switch S6 is turned on, data is stored in the first latch LAT1 by a voltage of the sensing node SO, or inverted data stored in the first latch LAT1 may be transmitted to the sensing node SO.

The first to fourth latches LAT1 to LAT4 may respectively store data sensed in a verify operation, and the fifth latch LAT5 may receive the data transmitted from the first to fourth latches LAT1 to LAT4. Therefore, the first to fourth latches LAT1 to LAT4 may be referred to as data input latches, and the fifth latch LAT5 may be referred to as a data output latch. A program allow voltage, a program inhibit voltage, or a program control voltage may be applied to the n-th bit line BLn according to the data stored in the fifth latch LAT5. For example, when both the second and third switches S2 and S3 are turned on according to data stored in a fifth node Q5 of the fifth latch LAT5, the program allow voltage (e.g., 0V) may be applied to the n-th bit line BLn. In addition, when the fourth switch S4 is turned on according to the data stored in the fifth node Q5 of the fifth latch LAT5, the program inhibit voltage (e.g., VCC) or the program control voltage may be applied to the n-th bit line BLn. Therefore, the fourth switch S4 may form a precharge circuit PRC, and the second and third switches S2 and S3 may form a discharge circuit DIC.

Each of the first to fifth latches LAT1 to LAT5 may include cross-coupled inverters IV. Data may be stored in terminals through which the inverters IV are connected to each other, and data opposite to each other may be stored in different nodes included in the same latch. The first latch LAT1 will be described as an example. Different data may be stored in a first node Q1 and a first inversion node Q1_N of the first latch LAT1. For example, when data 0 is stored in the first node Q1, data 0 may be stored in the first inversion node Q1_N. A state in which the first node Q1 is precharged to a positive voltage may be defined as that the data 1 is stored in the first latch LAT1, and a state in which the first node Q1 is discharged to 0V may be defined as that the data 0 is stored in the first latch LAT1. This may be equally applied to the second to fifth latches LAT2 to LAT5. That is, in this embodiment, data stored in the first to fifth latches LAT1 to LAT5 may mean data stored in first to fifth nodes Q1 to Q5, and inverted data may mean data stored in first to fifth inversion nodes Q1_N to Q5_N.

An eleventh switch S11 may be connected between the first node Q1 and a common sensing node CSO, and include an NMOS transistor controlled in response to a first reset signal RS1. A twelfth switch S12 may be connected between the first inversion node Q1_N and the common sensing node CSO, and include an NMOS transistor controlled in response to a first setup signal SE1. The first latch LAT1 may be reset in response to the first reset signal RS1 and the first setup signal SE1.

A thirteenth switch S13 may be connected between the second node Q2 and the common sensing node CSO, and include an NMOS transistor controlled in response to a second reset signal RS2. A fourteenth switch S14 may be connected between the second inversion node Q2_N and the common sensing node CSO, and include an NMOS transistor controlled in response to a second setup signal SE2. The second latch LA2 may be reset in response to the second reset signal RS2 and the second setup signal SE2.

A fifteenth switch S15 may be connected between the third node Q3 and the common sensing node CSO, and include an NMOS transistor controlled in response to a third reset signal RS3. A sixteenth switch S16 may be connected between the third inversion node Q3_N and the common sensing node CSO, and include an NMOS transistor controlled in response to a third setup signal SE3. The third latch LAT3 may be reset in response to the third reset signal RS3 and the third setup signal SE3.

A seventeenth switch S17 may be connected between the fourth node Q4 and the common sensing node CSO, and include an NMOS transistor controlled in response to a fourth reset signal RS4. An eighteenth switch S18 may be connected between the fourth inversion node Q4_N and the common sensing node CSO, and include an NMOS transistor controlled in response to a fourth setup signal SE4. The fourth latch LAT4 may be reset in response to the fourth reset signal RS4 and the fourth setup signal SE4.

A nineteenth switch S19 may be connected between the fifth node Q5 and the common sensing node CSO, and include an NMOS transistor controlled in response to a fifth reset signal RS5. A twentieth switch S20 may be connected between the fifth inversion node Q5_N and the common sensing node CSO, and include an NMOS transistor controlled in response to a fifth setup signal SE5. The fifth latch LAT5 may be reset in response to the fifth reset signal RS5 and the fifth setup signal SE5.

A twenty-first switch S21 may be connected between the node N1 and the sensing node SO, and include an NMOS transistor controlled in response to a sensing-off signal SOC.

For example, the twenty-first switch S21 may be turned on when the voltage of the n-th bit line BLn is transmitted to the first to fourth latches LAT1 to LAT4 (refer to V41), and be turned off when data stored in the first to fourth latches LAT1 to LAT4 are transmitted to the fifth latch LAT5 (refer to V42) and when the voltage of the n-th bit line BLn is controlled according to the data stored in the fifth latch LAT5.

A twenty-second switch S22 may be connected between the terminal to which the power supply voltage VCC is supplied and the sensing node SO, and include a PMOS transistor controlled in response to a precharge signal PRECHSO_N. When the twenty-second switch S22 is turned on, the power supply voltage VCC may be supplied to the sensing node SO such that a potential of the sensing node SO may be increased. The potential of the sensing node SO may be changed in a verify operation, and therefore, the twenty-second switch S22 may be turned on before the data stored in each of the first to fourth latches LAT1 to LAT4 is transmitted to the fifth latch LAT5.

For example, when the potential of the sensing node SO becomes high since the twenty-second switch S22 is turned on, the twenty-second switch S22 is turned off. Subsequently, data of the first to fourth latches LAT1 to LAT4 may be transmitted to the fifth latch LAT5. The twenty-second switch may be turned-on or turned off even when data of the first to third latches LAT1 to LAT3 are transmitted to the fifth latch LAT5. For example, when the potential of the sensing node SO becomes high since the twenty-second switch S22 is turned on, the twenty-second switch S22 may be turned off, and subsequently, data of the first latch LAT1 may be transmitted to the fifth latch LAT5. The twenty-second switch S22 may be turned on even before data of the second latch LAT is transmitted to the fifth latch LAT5 such that the potential of the sensing node SO becomes high. When the twenty-second switch S22 is turned off, the data of the second latch LAT2 may be transmitted to the fifth latch LAT5. In this manner, data stored in each of the first to fourth latches LAT1 to LAT4 may be transmitted to the fifth latch LAT5.

Figure 5:
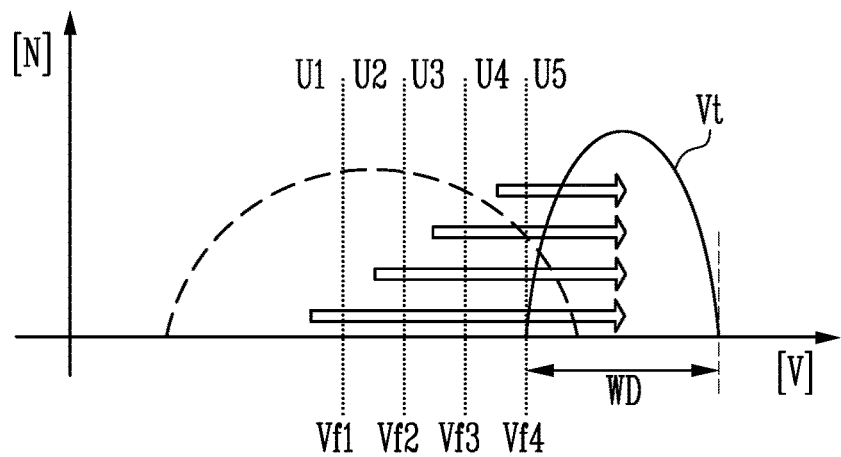
FIG. 5 is a diagram for describing a bit line voltage applied to bit lines, based on a result of a verify operation.

FIG. 5 is a diagram for describing a bit line voltage applied to bit lines, based on a result of a verify operation.

Referring to FIG. 5, the horizontal axis represents voltage V, and the vertical axis represents number N of memory cells. A program operation may include a program voltage applying operation of applying a program voltage to a selected word line and a verify operation of sensing a threshold voltage Vt of memory cells. The program voltage applying operation and the verify operation may constitute one program loop, and a plurality of program loops may be performed in the program operation. The program voltage may be increased in stages whenever the program loop is performed. Such a program method may be referred to as an Incremental Step Pulse Program (ISPP) method.

To improve the reliability of the memory device, the width WD of a threshold voltage Vt distribution of memory cells is narrowed as a number of bits to be stored in one memory cell increases. To narrow the width WD of the threshold voltage Vt distribution, in this embodiment, a plurality of verify operations using a plurality of verify voltages Vf1 to Vf4 may be performed, and a voltage of bit lines for a next program loop may be set, based on a result of each of the verify operations. In this embodiment, first to fourth verify voltages Vf1 to Vf4 are used, however, the number of verify voltages is not limited thereto.

In this embodiment, the first to fourth verify voltages Vf1 to Vf4 may be used for the purpose of one target threshold voltage. When the first verify voltage Vf1 is set as the lowest verify voltage, a verify voltage may be set as a high verify voltage approaching the fourth verify voltage Vf4. The fourth verify voltage Vf4 may be a target verify voltage. That is, a memory cell having a threshold voltage equal to or higher than the fourth verify voltage Vf4 may be cell which passed the verify operation, and a memory cell having a threshold voltage lower than the fourth verify voltage Vf4 may be a cell which failed the verify operation. In the program operation using the ISPP method, program loops may be repeated until selected memory cells are all equal to or greater than the fourth verify voltage Vf4. The number of times the program loop is performed is limited, and the selected memory blocks may be processed as a bad block when the verify operation fails even though the program loop is performed up to the limited number of times.

In the program operation using the ISPP method, a threshold voltage of memory cells may be divided into first to fifth states U1 to U5 with respect to the first to fourth verify voltages Vf1 to Vf4. For example, the first state U1 is a state in which the threshold voltage is lower than the first verify voltage Vf1, and the second state U2 is a state in which the threshold voltage is between the first and second verify voltages Vf1 and Vf2. The third state U3 is a state in which the threshold voltage is between the second and third verify voltages Vf2 and Vf3, and the fourth state U4 is a state in which the threshold voltage is between the third and fourth verify voltages Vf3 and Vf4. Since the fifth state U5 is a state in which the threshold voltage is higher than the fourth verify voltage Vf4, the fifth state U5 is a state in which the verify operation passes. That is, the first to fourth states U1 to U4 are states in which the verify operation fails. Data stored in the first to fourth latches (LAT1 to LAT4 shown in FIG. 4) in the verify operation of the memory cells are shown in 'Table 1.' In 'Table 1,' the data stored in the first to fourth latches LAT1 to LAT4 will be described using data stored in the first to fourth inversion nodes Q1_N to Q4_N as an example.

TABLE 1

|      | U1 | U2 | U3 | U4 | U5 |
|------|----|----|----|----|----|
| Q1_N | 0  | 1  | 1  | 1  | 1  |
| Q2_N | 0  | 0  | 1  | 1  | 1  |
| Q3_N | 0  | 0  | 0  | 1  | 1  |
| Q4_N | 0  | 0  | 0  | 0  | 1  |

Referring to 'Table 1,' when a memory cell in the first state U1 is verified using the first to fourth verify voltages Vf1 to Vf4, data 0 may be stored in the first to fourth inversion nodes Q1_N to Q4_N. When a memory cell in the second state U2 is verified using the first to fourth verify voltages Vf1 to Vf4, data 1 may be stored in the first inversion node Q1_N, and data 0 may be stored in the second to fourth inversion nodes Q2_N to Q4_N. When a memory cell in the third state U3 is verified using the first to fourth verify voltages Vf1 to Vf4, data 1 may be stored in the first and second inversion nodes Q1_N and Q2_N, and data 0 may be stored in the third and fourth inversion nodes Q3_N and Q4_N. When a memory cell in the fourth state U4 is verified using the first to fourth verify voltages Vf1 to Vf4, data 1 may be stored in the first to third inversion nodes Q1_N to Q3_N, and data 0 may be stored in the fourth inversion node Q4_N. When a memory cell in the fifth state U5 is verified using the first to fourth verify voltages Vf1 to Vf4, data 1 may be stored in the first to fourth inversion nodes Q1_N to Q4_N.

Therefore, when the verify operation of the selected memory cells fails, a program inhibit voltage may be applied to bit lines connected to memory cells in the fifth state U5, and a program allow voltage or a program control voltage may be selectively applied to bit lines connected to memory cells in the first to fourth states U1 to U4.

The program inhibit voltage may be a positive voltage which allows the threshold voltage of the memory cells not to be increased by the program voltage, and the program allow voltage may be a voltage which is lower than the program voltage and is different from the program voltage. For example, the program allow voltage may be 0V. The program allow voltage may be applied to bit lines connected to memory cells in the first state U1.

The program control voltage may be a positive voltage applied to bit lines connected to memory cells in the second to fourth states U2 to U4. That is, the program control voltage may be a voltage applied to the bit lines to control a threshold voltage variation caused by the program voltage since the threshold voltage of the memory cells has come close to the fourth verify voltage Vf4 as the target verify voltage.

For example, in the same loop, the program allow voltage and the program control voltage may be used to increase the threshold voltage of the memory cells in the first state U1 to the highest degree, increase the threshold voltage of the memory cells in the second state U2 to a next high degree, and increase the threshold voltage of the memory cells in the fourth state U4 to the lowest degree.

Program allow voltages having different levels may be used according to the second to fourth states U2 to U4, but in order to apply program allow voltages having various levels to the bit lines, additional circuits are required for the page buffers. Therefore, the size of the memory device may be increased, and power consumption may also be increased.

Accordingly, in this embodiment, a program operation can be performed, which can narrow the width of a threshold voltage distribution without increasing the size of the memory device and the power consumption, not by controlling levels of program allow voltages applied to the bit lines but by controlling the time required to apply the program allow voltage to the bit lines.

Figure 6:
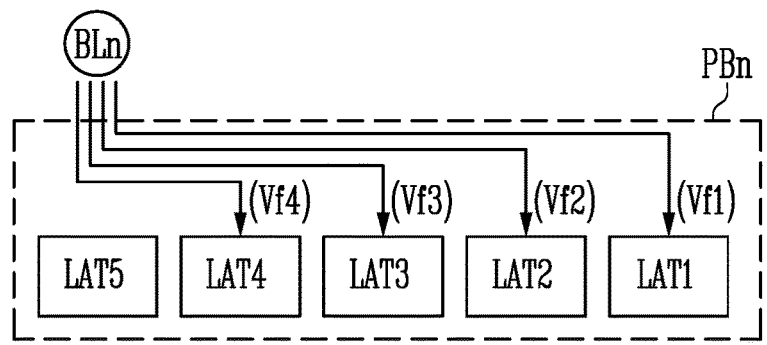
FIGS. 6 and 7 are diagrams illustrating a bit line voltage setting method in accordance with an embodiment of the present disclosure.
Figure 7:
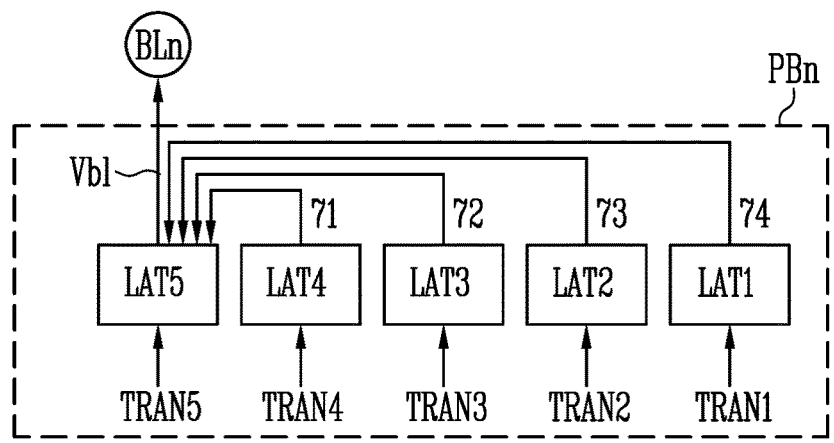

FIGS. 6 and 7 are diagrams illustrating a bit line voltage setting method in accordance with an embodiment of the present disclosure. FIG. 6 is a diagram illustrating a verify operation, and FIG. 7 is a diagram illustrating a program operation.

In FIGS. 6 and 7, a sensing operation of the n-th page buffer PBn connected to the n-th bit line BLn will be described as an example.

Referring to FIG. 6, a verify operation of verifying whether a threshold voltage of a memory cell has been increased to a target voltage may be performed using a plurality of verify voltages. In this embodiment, a case where four verify voltages Vf1 to Vf4 are used is described, however, the number of verify voltages is not limited thereto.

When a fourth verify voltage Vf4 among first to fourth verify voltages Vf1 to Vf4 is a target voltage, the third verify voltage Vf3 may be set lower than the fourth verify voltage Vf4, the second verify voltage Vf2 may be set lower than the third verify voltage Vf3, and the first verify voltage Vf1 may be set lower than the second verify voltage Vf2. The first to third verify voltages Vf1 to Vf3 are all lower than the fourth verify voltage Vf4, but may be set higher than another target voltage lower than the fourth verify voltage Vf4.

In the verify operation of selected memory cells, verify operations using the first to fourth verify voltages Vf1 to Vf4 may be sequentially performed. Verify results with respect to the first to fourth verify voltages Vf1 to Vf4 may be respectively stored in the first to fourth latches LAT1 to LAT4. For example, data sensed in the verify operation using the first verify voltage Vf1 may be stored in the first latch LAT1, and data sensed in the verify operation using the second verify voltage Vf2 may be stored in the second latch LAT2. Data sensed in the verify operation using the third verify voltage Vf3 may be stored in the third latch LAT3, and data sensed in the verify operation using the fourth verify voltage Vf4 may be stored in the fourth latch LAT4.

When the verify operation is performed based on a voltage of the n-th bit line BLn, the n-th bit line BLn may be precharged to a positive voltage, and the first verify voltage Vf1 may be applied to a selected word line. When the threshold voltage of the selected memory cell is lower than the first verify voltage Vf1, the selected memory cell is in a turn-on state, and therefore, the voltage of the n-th bit line BLn may be decreased to 0V. Data 0 may be stored in the first inversion node (Q1_N shown in FIG. 4) of the first latch LAT1. When the threshold voltage of the selected memory cell is higher than the first verify voltage Vf1, the selected memory cell is in a turn-off state, and therefore, the voltage of the n-th bit line BLn may be maintained as the positive voltage. Data 1 may be stored in the first inversion node (Q1_N shown in FIG. 4) of the first latch LAT1.

After the data sensed in the verify operation using the first verify voltage Vf1 is stored in the first latch LAT1, the verify operation using the second verify voltage Vf2 may be performed. The verify operation using the second verify voltage Vf2 may be performed on the same memory cell on which the verify operation using the first verify voltage Vf1 is performed. That is, only the verify voltage applied to the selected word line is changed.

As a result of the verify operation using the second verify voltage Vf2, when the threshold voltage of the selected memory cell is lower than the second verify voltage Vf2, data 0 may be stored in the second inversion node (Q2_N shown in FIG. 4) of the second latch LAT2. When the threshold voltage of the selected memory cell is higher than the second verify voltage Vf2, data 1 may be stored in the second inversion node (Q2_N shown in FIG. 4) of the second latch LAT2.

In this manner, when the verify operations using the first to fourth verify voltages Vf1 to Vf4 are sequentially performed, data regarding the verify operations using the first to fourth verify voltages Vf1 to Vf4 may be respectively stored in the first to fourth latches LAT1 to LAT4.

For example, when the selected memory cell is in the first state (U1 shown in FIG. 5), data 0 may be stored in all the first to fourth latches LAT1 to LAT4. When the selected memory cell is in the second state (U2 shown in FIG. 5), data 1 may be stored in the first latch LAT1, and data 0 may be stored in all the second to fourth latches LAT2 to LAT4. When the selected memory cell is in the third state (U3 shown in FIG. 5), data 1 may be stored in the first and second latches LAT1 and LAT2, and data 0 may be stored in the third and fourth latches LAT3 and LAT4. When the selected memory cell is in the fourth state (U4 shown in FIG. 5), data 1 may be stored in the first to third latches LAT1 to LAT3, and data 0 may be stored in the fourth latch LAT4. When the selected memory cell is in the fifth state (U5 shown in FIG. 5), data 1 may be stored in all the first to fourth latches LAT1 to LAT4. The data stored in the latches may mean data stored in the inversion nodes Q1_N to Q4_N of the latches.

Referring to FIG. 7, data are stored in the first to fourth latches LAT1 to LAT4, during an operation of programming a selected memory cell. The voltage of the n-th bit line BLn may vary by sequentially using the data stored in the first to fourth latches LAT1 to LAT4. By controlling the first to fifth transmission signals TRAN1 to TRAN5, each of the data stored in the first to fourth latches LAT1 to LAT4 may be transmitted to the fifth latch LAT5. The bit line voltage Vb1 applied to the n-th bit line BLn may vary depending on the data stored in the fifth latch LAT5. In an order in which the data are transmitted, data stored in the fourth latch LAT4 may be preferentially transmitted to the fifth latch LAT5 (71), and subsequently, data stored in the first to third latches LAT1 to LAT3 may be sequentially transmitted to the fifth latch LAT5 in an order of the third latch LAT3, the second latch LAT2, and the first latch LAT1 (72, 73, and 74). Alternatively, after data stored in the fourth to second latches LAT4 to LAT2 are simultaneously transmitted to the fifth latch LAT5, data stored in the first latch LAT1 may be lastly transmitted to the fifth latch LAT5.

That is, in this embodiment, the time required to apply the program control voltage to the bit line is delayed as the difference between the threshold voltage of the memory cell and the target voltage is increased, and is increased as the difference between the threshold voltage of the memory cell and the target voltage is decreased, so that a variation in threshold voltage can be controlled. Accordingly, the width of a threshold voltage distribution of memory cells can be narrowed.

In some embodiments, the order in which the data stored in the first to fourth latches LAT1 to LAT4 are transmitted may vary, and various voltages used in the program operation may also vary together with the order of the data transmitted.

Various embodiments based on the above-described method will be described in detail with reference to FIGS. 8 to 12. FIGS. 8 to 12 illustrate steps after data is stored in each of the first to fourth latches LAT1 to LAT4 by the verify operation using the first to fourth verify voltages Vf1 to Vf4.

Figure 8:
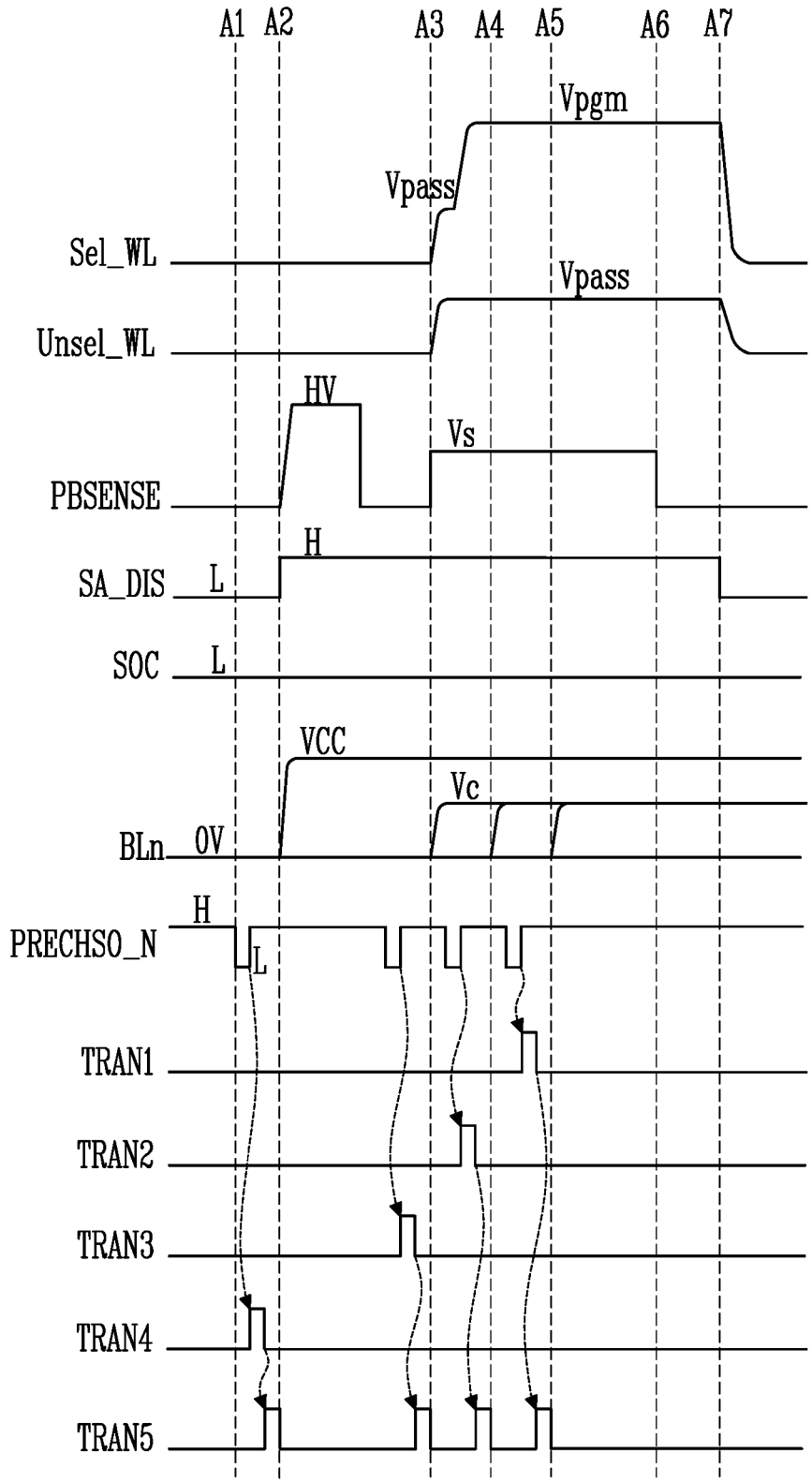
FIG. 8 is a diagram illustrating waveforms for describing a program operation method in accordance with a first embodiment of the present disclosure.

FIG. 8 is a diagram illustrating waveforms for describing a program operation method in accordance with a first embodiment of the present disclosure.

Referring to FIGS. 4 and 8, in the first embodiment, levels of a program voltage Vpgm and the page sensing signal PBSENSE may be constantly maintained, and the voltage of the n-th bit line BLn may vary depending on the time required to transmit data stored in the first to fourth latches LAT1 to LAT4 to the fifth latch LAT5.

In a section between A1 to A2, the twenty-first switch S21 is turned off according to the sensing-off signal SOC of a low logic level L, so that the connection between the node N1 and the sensing node SO is interrupted. When the precharge signal PRECHSO_N is toggled from a high logic level H to the low logic level L, the sensing node SO is precharged to the high logic level H. When the fourth transmission signal TRAN4 and the fifth transmission signal TRAN5 are sequentially toggled to the high logic level H, data stored in the fourth inversion node Q4_N of the fourth latch LAT4 is transmitted to the fifth inversion node Q5_N of the fifth latch LAT5. For example, when data 1 is stored in the fifth inversion node Q5_N, data 0 is stored in the fifth node Q5. When data 0 is stored in the fifth inversion node Q5_N, data 1 is stored in the fifth node Q5.

The discharge signal SA_DIS is changed from the low logic level L to the high logic level H from the time A2.

However, in some embodiments, the discharge signal SA_DIS may be changed to the high logic level H from the time A1.

In a section between A2 to A3, when the data of the fifth node Q5 is 1, the third switch S3 is turned on and the fourth switch S4 is turned off. Therefore, the node N1 may be discharged to 0V. When the page sensing signal PBSENSE having a level of a high voltage HV is applied to the first switch S1, the first switch S1 may be turned on according to the high voltage HV. Since the first to third switches S1 to S3 are all turned on, a current path is formed between the n-th bit line BLn and the ground terminal GND, so that the potential of the n-th bit line BLn becomes 0V. The 0V may be the program allow voltage.

When the data of the fifth node Q5 is 0, the third switch S3 is turned off and the fourth switch S4 is turned on. Therefore, the node N1 may be precharged to a level of a power supply voltage VCC. When the page sensing signal PBSENSE is applied at the level of the high voltage HV to the first switch S1, the turn-on level of the first switch S1 may be increased. Since the third switch S3 is turned off and the fourth switch S4 is turned on, a current path is formed between the n-th bit line BLn and a power supply voltage VCC terminal, so that the potential of the n-th bit line BLn is precharged to the level of the power supply voltage VCC. The power supply voltage VCC may be used as the program inhibit voltage. Subsequently, the page sensing signal PBSENSE is changed to the low logic level L so as to set a next level.

When the precharge signal PRECHSO_N is toggled from the high logic level H to the low logic level L, the sensing node SO is precharged to the high logic level H. When the third transmission signal TRAN3 and the fifth transmission signal TRAN5 are sequentially toggled to the high logic level H, data stored in the third inversion node Q3_N of the third latch LAT3 is transmitted to the fifth inversion node Q5_N of the fifth latch LAT5.

In a section between A3 to A4, a pass voltage Vpass is applied to unselected word lines Unsel-WL and a selected word line Sel-WL, and the second transmission signal TRAN2 is changed to the high logic level H. When the page sensing signal PBSENSE having a level of a sensing voltage Vs is applied to the first switch Si, the first switch S1 may be turned on according to the level of the sensing voltage Vs. The sensing voltage Vs may be a positive voltage lower than the high voltage HV. Therefore, a turn-on level of the first switch S1 to which the sensing voltage Vs is applied may be lower than that of the first switch S1 to which the high voltage HV is applied.

When the precharge signal PRECHSO_N is toggled from the high logic level H to the low logic level L, the sensing node SO is precharged to the high logic level H. When the second transmission signal TRAN2 and the fifth transmission signal TRAN5 are sequentially toggled to the high logic level H, data stored in the second inversion node Q2_N of the second latch LAT2 is transmitted to the fifth inversion node Q5_N of the fifth latch LAT5.

When the data of the fifth node Q5 is 1, the fourth switch S4 is turned off, and the first to third switches S1 to S3 are all turned on. Therefore, a current path is formed between the n-th bit line BLn and the ground terminal GND, so that the potential of the n-th bit line BLn becomes 0V. The 0V may be the program allow voltage.

When the data of the fifth node Q5 is 0, the fourth switch S4 is turned on. Therefore, a current path is formed between the n-th bit line BLn and the power supply voltage VCC terminal, so that a program control voltage Vc having a positive voltage is applied to the n-th bit line BLn. The program control voltage Vc may be a positive voltage which is higher than the program allow voltage and is lower than the program inhibit voltage. The level of the program control voltage Vc may be controlled according to the turn-on level of the first switch S1.

When the voltage of the n-th bit line BL1n is set, the program voltage Vpgm may be applied to the selected word line Sel-WL.

In a section between A4 to A5, when the precharge signal PRECHSO_N is toggled from the high logic level H to the low logic level L, the sensing node SO is precharged to the high logic level H. When the first transmission signal TRAN1 and the fifth transmission signal TRAN5 are sequentially toggled to the high logic level H, data stored in the first inversion node Q1_N of the first latch LAT1 is transmitted to the fifth inversion node Q5_N of the fifth latch LAT5. The program control voltage or the program allow voltage may be applied to the n-th bit line BLn according to the data transmitted to the fifth latch LAT5. In some embodiments, times of the sections between A1 to A2, between A2 to A3, between A3 to A4, and between A4 to A5 may vary.

During a section between A5 to A6, selected memory cells may be programmed according to the voltage applied to the n-th bit line BLn and the program voltage Vpgm applied to the selected word line Sel-WL.

In a section between A6 to A7, the page sensing signal PBSENSE may be changed to the low logic level L.

At A7, all lines may be discharged to perform a next verify operation.

As described above, data as results of verify operations using different verify voltages are transmitted to the fifth latch LAT5 at different times, the time required to apply the program control voltage to the n-th bit line BLn is controlled according to the data transmitted to the fifth latch LAT5, so that a variation in threshold of a memory cell can be controlled. That is, the time required to apply a voltage to the n-th bit line BLn is controlled without controlling the level of the voltage applied to the n-th bit line BLn according to the threshold voltage of the memory cell, so that circuits for generating program control voltages having various levels are unnecessary. Thus, a program operation of narrowing the threshold voltage of the memory cell, without increasing the size of the memory device, can be performed.

Figure 9:
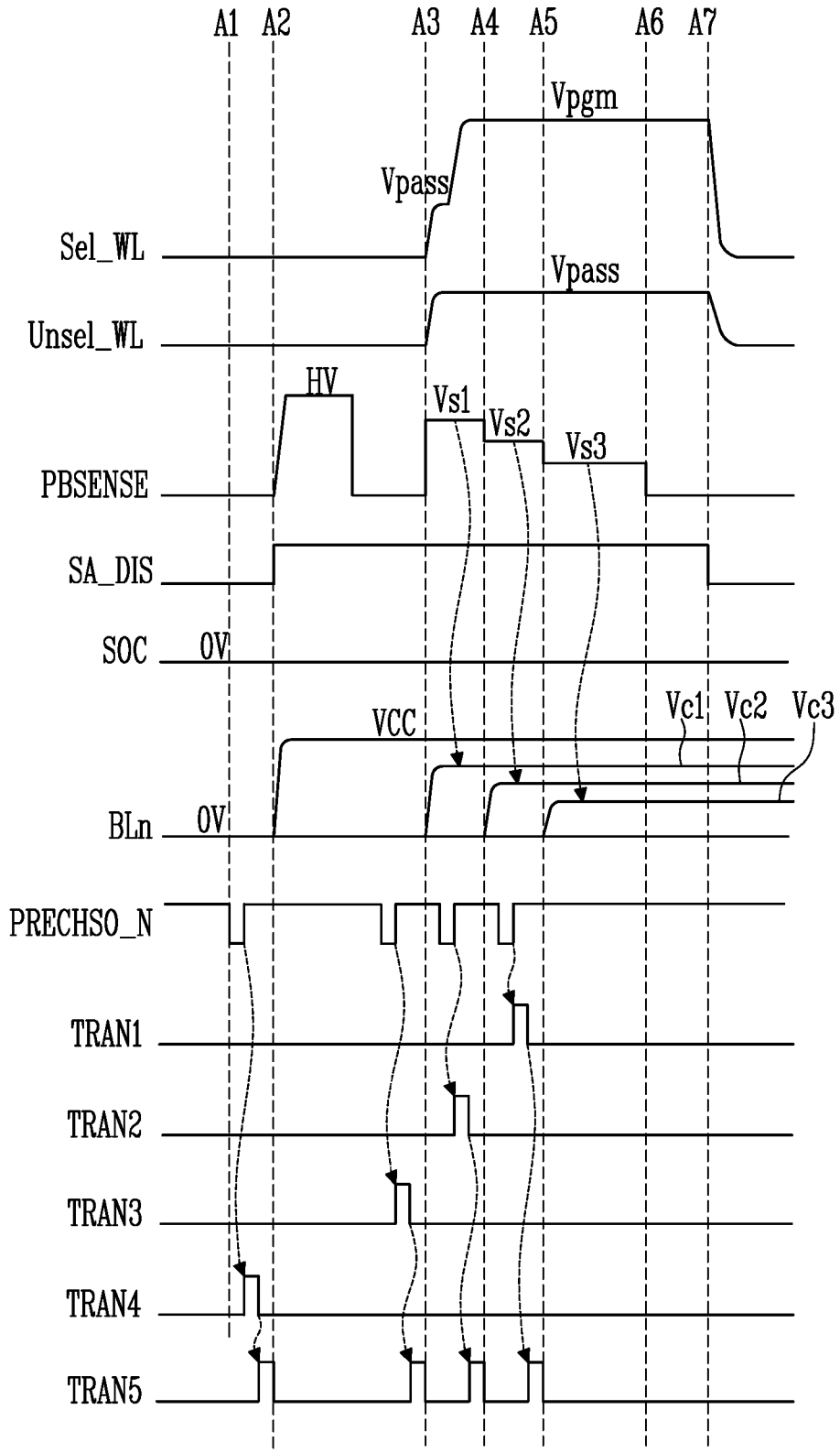
FIG. 9 is a diagram illustrating waveforms for describing a program operation method in accordance with a second embodiment of the present disclosure.

FIG. 9 is a diagram illustrating waveforms for describing a program operation method in accordance with a second embodiment of the present disclosure.

Referring to FIG. 9, in the second embodiment, the other signals except the page sensing signal PBSENSE may be controlled similarly to those in the first embodiment. In the second embodiment, the level of the page sensing signal PBSENSE may be decreased in stages (i.e., stepped down) according to the time for which the first to third transmission signals TRAN1 to TRAN3 are sequentially changed to the high logic level H. For example, in a section between A3 to A4, the page sensing signal PBSENSE may be set to a first sensing voltage Vs1 having a positive voltage lower than the high voltage HV. In a section A4 to A5, the page sensing signal PBSENSE may be set to a second sensing voltage Vs2 having a positive voltage lower than the first sensing voltage Vs1. In a section between A5 to A6, the page sensing signal PBSENSE may be set to a third sensing voltage Vs3 having a positive voltage lower than the second sensing voltage Vs2.

When the page sensing signal PBSENSE becomes the level of the first sensing voltage Vs1, the first switch S1 is turned on according to the first sensing voltage Vs1, and therefore, a first program control voltage Vc1 or a program allow voltage may be applied to the n-th bit line BLn. When the page sensing signal PBSENSE becomes the level of the second sensing voltage Vs2, the first switch S1 is turned on according to the second sensing voltage Vs2, and therefore, a second program control voltage Vc2 or a program allow voltage, which is lower than the first program control voltage Vc1, may be applied to the n-th bit line BLn. When the page sensing signal PBSENSE becomes the level of the third sensing voltage Vs3, the first switch S1 is turned on according to the third sensing voltage Vs3, and therefore, a third program control voltage Vc3 or a program allow voltage, which is lower than the second program control voltage Vc2, may be applied to the n-th bit line BLn.

In the second embodiment, sections between A1 to A3 and between A6 to A7 are performed identically to those in the first embodiment, and therefore, detailed descriptions will be omitted.

Figure 10:
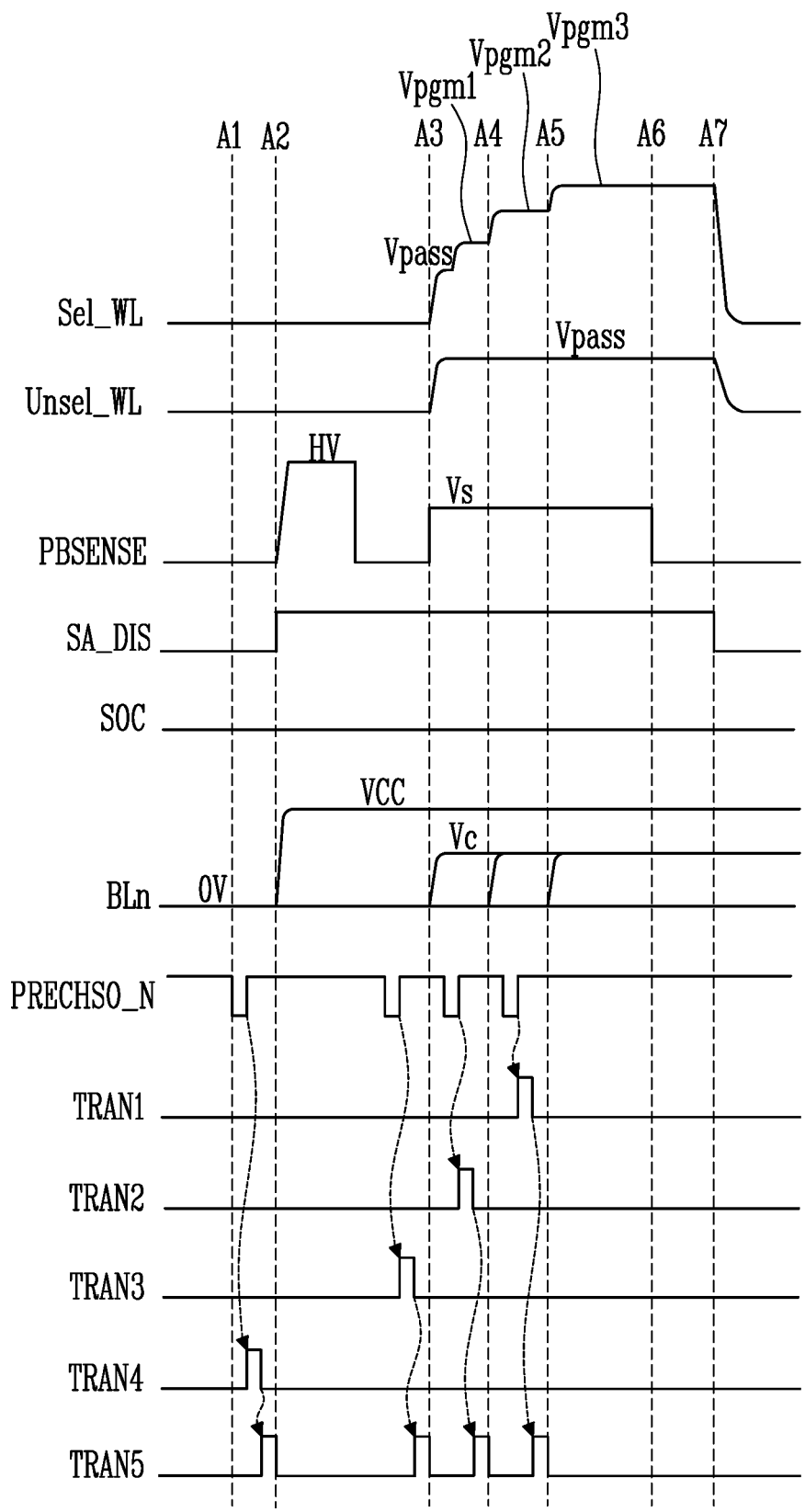
FIG. 10 is a diagram illustrating waveforms for describing a program operation method in accordance with a third embodiment of the present disclosure.

FIG. 10 is a diagram illustrating waveforms for describing a program operation method in accordance with a third embodiment of the present disclosure.

Referring to FIG. 10, the other signals except program voltages Vpgm1 to Vpgm3 may be controlled similarly to those in the first embodiment. In the third embodiment, the program voltage Vpgm may be increased to a first program voltage Vpgm1 higher than the pass voltage Vpass in a section between A3 to A4, be increased to a second program voltage Vpgm2 higher than the first program voltage Vpgm1 in a section between A4 to A5, and be increased to a third program voltage Vpgm3 higher than the second program voltage Vpgm2 in a section between A5 to A6. That is, a low program voltage may be applied to the selected word line Sel_WL as the threshold voltage comes close to the target voltage, and a high program voltage may be applied to the selected word line Sel_WL as the difference between the threshold voltage and the target voltage is increased. The third program voltage Vpgm3 in the third embodiment may be set equally to the program voltage Vpgm in the first embodiment.

Figure 11:
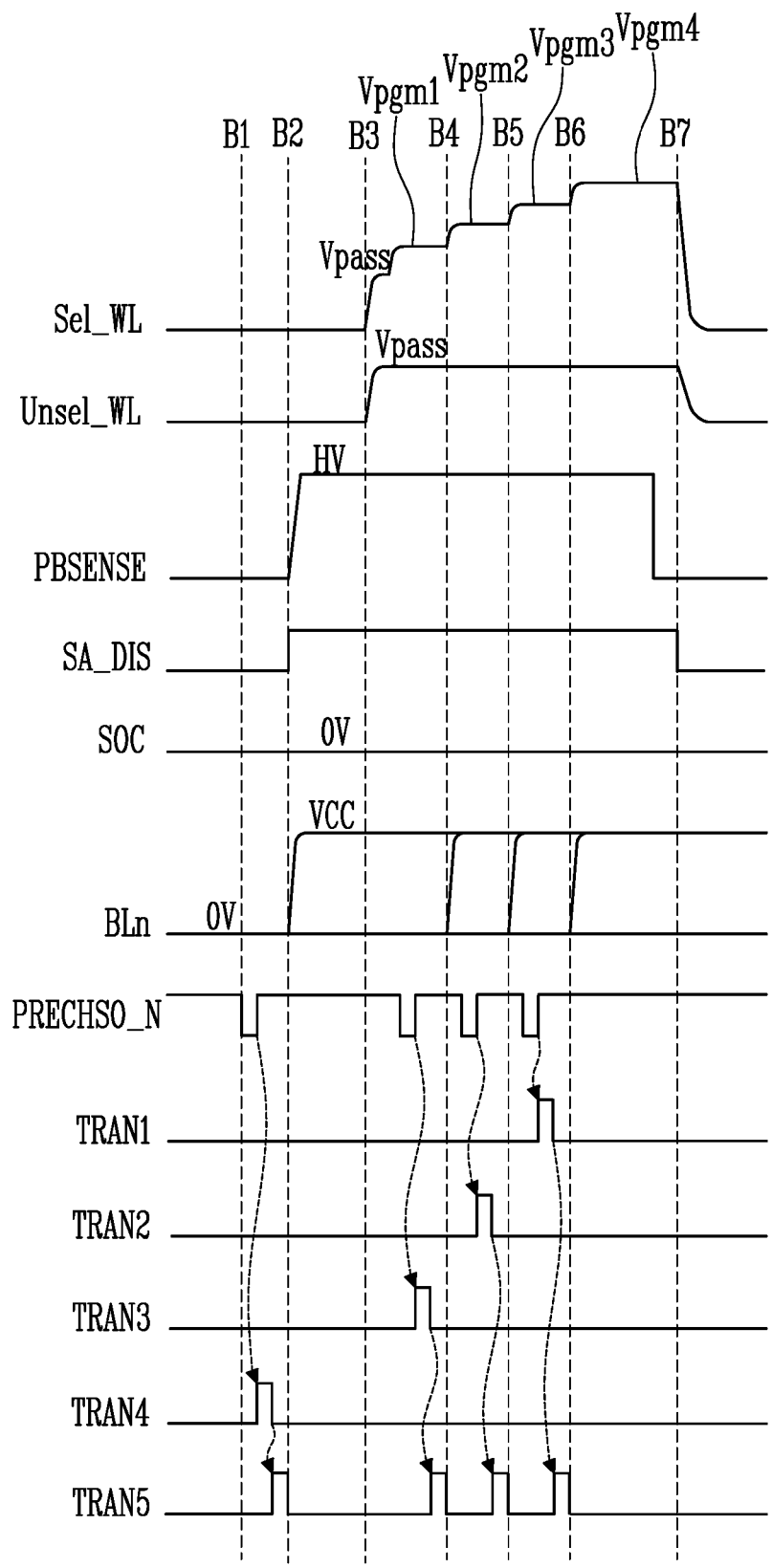
FIG. 11 is a diagram illustrating waveforms for describing a program operation method in accordance with a fourth embodiment of the present disclosure.

FIG. 11 is a diagram illustrating waveforms for describing a program operation method in accordance with a fourth embodiment of the present disclosure.

Referring to FIG. 11, in the fourth embodiment, the time for which the fourth to first transmission signals TRAN4 to TRAN1 are changed to the high logic level H and the level of the program voltage may be controlled, while the page sensing signal PBSENSE is being maintained as a constant level of the high voltage HV.

In a section between B1 to B2, the twenty-first switch S21 is turned off according to the sensing-off signal SOC of the low logic level L, so that the connection between the node N1 and the sensing node SO is interrupted. When the precharge signal PRECHSO_N is toggled from the high logic level H to the low logic level L, the sensing node SO is precharged to the high logic level H. When the fourth transmission signal TRAN4 and the fifth transmission signal TRAN5 are sequentially toggled to the high logic level H, data stored in the fourth latch LAT4 is transmitted to the fifth latch LAT5.

In a section between B2 to B3, the page sensing signal PBSENSE having the level of the high voltage HV is applied to the first switch S1, the first switch S1 may be turned on according to the level of the high voltage HV.

When the first switch S1 is turned on, a program allow voltage 0V or a program inhibit voltage VCC may be applied to the n-th bit line BLn according to the data stored in the fifth latch LAT5.

In a section between B3 to B4, the pass voltage Vpass may be applied to the unselected word lines Unsel_WL and the selected word line Sel_WL, and subsequently, a first program voltage Vpgm1 higher than the pass voltage Vpass may be applied to the selected word line Sel_WL. In the section between B3 to B4, since data stored in the third latch LAT3 is transmitted to the fifth latch LAT5, a voltage of the n-th bit line BLn may be determined according to the data stored in the third latch LAT3. Therefore, when data 0 is stored in the third inversion node Q3_N of the third latch LAT3, the program allow voltage 0V may be applied to the n-th bit line BLn. When data 1 is stored in the third inversion node Q3_N of the third latch LAT3, the program inhibit voltage VCC may be applied to the n-th bit line BLn. In the section between B3 to B4, since the first program voltage Vpgm1 which is relatively lower than other program voltages, is applied to the selected word line Sel_WL, a variation in threshold voltage of a selected memory cell may be may be smaller than that when the maximum program voltage is applied.

In a section between B4 to B5, a second program voltage Vpgm2 higher than the first program voltage Vpgm1 may be applied to the selected word line Sel_WL. The second transmission signal TRAN2 may be changed to the high logic level H, so that data stored in the second latch LAT2 is transmitted to the fifth latch LAT5, and the program allow voltage 0V or the program inhibit voltage VCC may be applied to the n-th bit line BLn according to the data transmitted to the fifth latch LAT5. For example, when the program inhibit voltage is applied to the n-th bit line BLn in the section between B3 to B4, the program inhibit voltage may be continuously applied even in the section between B4 to B5. When the program allow voltage is applied to the n-th bit line BLn in the section between B3 to B4, the program allow voltage or the program inhibit voltage may be applied to the n-th bit line BLn according to the data transmitted to the fifth latch LAT5.

In a section between B5 to B6, a third program voltage Vpgm3 higher than the second program voltage Vpgm2 may be applied to the selected word line Sel_WL. The first transmission signal TRAN1 may be changed to the high logic level H, so that data stored in the first latch LAT1 is transmitted to the fifth latch LAT5, and the program allow voltage 0V or the program inhibit voltage VCC may be applied to the n-th bit line BLn according to the data transmitted to the fifth latch LAT5. For example, when the program inhibit voltage is applied to the n-th bit line BLn in the section between B4 to B5, the program inhibit voltage may be continuously applied even in the section between B5 to B6. When the program allow voltage is applied to the n-th bit line BLn in the section between B4 to B5, the program allow voltage or the program inhibit voltage may be applied to the n-th bit line BLn according to the data transmitted to the fifth latch LAT5.

During a section between B6 to B7, selected memory cells may be programmed according to the voltage applied to the n-th bit line BLn and the program voltage Vpgm applied to the selected word line Sel_WL, and the sensing signal PBSENSE may be changed to the low logic level L after a certain time.

At time A7, all lines may be discharged to perform a next verify operation.

Figure 12:
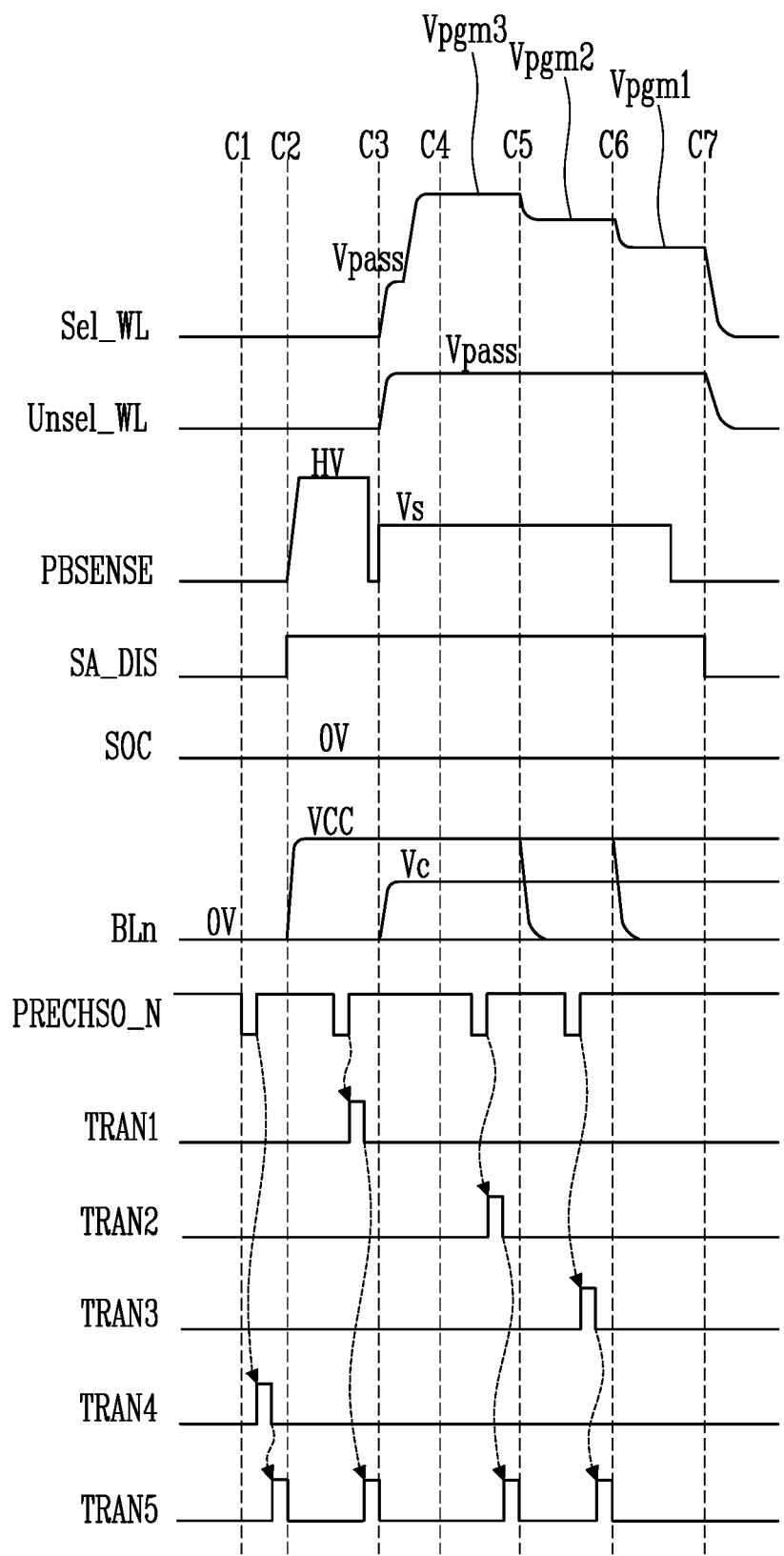
FIG. 12 is a diagram illustrating waveforms for describing a program operation method in accordance with a fifth embodiment of the present disclosure.

FIG. 12 is a diagram illustrating waveforms for describing a program operation method in accordance with a fifth embodiment of the present disclosure.

Referring to FIG. 12, in the fifth embodiment, the levels of program voltages may be controlled. For example, unlike the first to fourth embodiments, in the fifth embodiment, data (see Table 1) stored in the first to fourth latches LAT1 to LAT4 after the verify operation may be reset by an operation.

In the fifth embodiment, data stored in the first and second latches LAT1 and LAT2 may be XOR operated to be stored in the first latch LAT1, data stored in the second and third latches LAT2 and LAT3 may be XOR operated to be stored in the second latch LAT2, data stored in the third and fourth latches LAT3 and LAT4 may be XOR operated to be stored in the third latch LAT3, and data stored in the first to third latches LAT1 to LAT3 may be XOR operated to be stored in the fourth latch LAT4. When the data of 'Table 1' are reset by the above-described operation, the reset data are shown in 'Table 2.'

The second state U2 will be described as an example. In 'Table 1,' when the verify operation of the second state U2 is performed, data 1 is stored in the first and fourth latches LAT1 and LAT4, and data 0 is stored in the second and third latches LAT2 and LAT3. When data stored in the first and second latches LAT1 and LAt2 are XOR operated, the data becomes 1, and therefore, data 1 may be stored in the first latch LAT1 of the second state U2. When data stored in the second and third latches LAT2 and LAT3 are XOR operated, the data becomes 0, and therefore, data 0 may be stored in the second latch LAT2 of the second state U2. When data stored in the third and fourth latches LAT3 and LAT4 are XOR operated, the data becomes 1, and therefore, data 0 may be stored in the third latch LAT3 of the second state U2. When data stored in the first to third latches LAT1 to LAT3 are XOR operated, the data becomes 1, and therefore, data 1 may be stored in the fourth latch LAT4 of the second state U2. Data reset by the above-described operation are shown in 'Table 2.'

TABLE 2

|      | U1 | U2 | U3 | U4 | U5 |
|------|----|----|----|----|----|
| Q1_N | 0  | 1  | 0  | 0  | 0  |
| Q2_N | 0  | 0  | 1  | 0  | 0  |
| Q3_N | 0  | 0  | 0  | 1  | 0  |
| Q4_N | 0  | 1  | 1  | 1  | 1  |

In a section between C1 to C2, the twenty-first switch S21 is turned off according to the sensing-off signal SOC of the low logic level L, so that the connection between the node N1 and the sensing node SO is interrupted. When the precharge signal PRECHSO_N is toggled from the high logic level H to the low logic level L, the sensing node SO is precharged to the high logic level H. When the fourth transmission signal TRAN4 and the fifth transmission signal TRAN5 are sequentially toggled to the high logic level H, data stored in the fourth latch LAT4 may be transmitted to the fifth latch LAT5.

In a section between C2 to C3, when the page sensing signal PBSENSE having the level of the high voltage HV is applied to the first switch S1, the first switch S1 is turned on, and therefore, the program allow voltage 0V or the program inhibit voltage VCC may be applied to the n-th bit line BLn according to the data stored in the fifth latch LAT5.

In a section between C2 to C3, when the precharge signal PRECHSO_N is toggled from the high logic level H to the low logic level L, the sensing node SO is precharged to the high logic level H. When the first transmission signal TRAN1 and the fifth transmission signal TRAN5 are sequentially toggled to the high logic level H, data stored in the first latch LAT1 may be transmitted to the fifth latch LAT5.

The discharge signal SA_DIS is changed from the low logic level L to the high logic level H from the time C2. In some embodiments, the discharge signal SA_DIS may be changed to the high logic level H from the time C1.

In a section between C3 to C4, when the page sensing signal PBSENSE having the level of the sensing voltage Vs is applied to the first switch S1, the first switch S1 may be turned on according to the level of the sensing voltage Vs. Therefore, a turn-on level of the first switch S1 to which the sensing voltage Vs is applied may be lower than that of the first switch to which the high voltage HV is applied.

The pass voltage Vpass may be applied to the unselected word lines Unsel_WL and the selected word line Sel_WL, and subsequently, a third program voltage Vpgm3 may be applied to the selected word line Sel_WL. The third program voltage Vpgm3 may be a voltage equal to the third program voltage Vpagm3 of the third embodiment. Memory cells may be programmed according to the voltage of the n-th bit line BLn and the third program voltage Vpgm3.

In a section between C4 to C5, when the precharge signal PRECHSO_N is toggled from the high logic level H to the low logic level L, the sensing node SO may be precharged to the high logic level H. When the second transmission signal TRAN2 and the fifth transmission signal TRAN5 are sequentially toggled to the high logic level H, data stored in the second latch LAT2 may be transmitted to the fifth latch LAT5. The program allow voltage (i.e., 0V) or the program control voltage Vc may be applied to the n-th bit line BLn according to the data transmitted to the fifth latch LAT5.

In a section between C5 to C6, the third program voltage Vpgm3 applied to the selected word line Sel_WL may be decreased to a second program voltage Vpgm2. When the precharge signal PRECHSO_N is toggled from the high logic level H to the low logic level L, the sensing node SO may be precharged to the high logic level H. When the third transmission signal TRAN3 and the fifth transmission signal TRAN5 are sequentially toggled to the high logic level H, data stored in the third latch LAT3 may be transmitted to the fifth latch LAT5. The potential of the n-th bit line BLn may maintain a previous level or decrease according to the data transmitted to the fifth latch LAT5.

In a section between C6 to C7, the second program voltage Vpgm2 applied to the selected word line Sel_WL may be decreased to a first program voltage Vpgm1. Selected memory cells may be programmed according to the voltage applied to the n-th bit line BLn and the program voltage Vpgm applied to the selected word line Sel_WL. The potential of the n-th bit line BLn may maintain a previous level or be decreased according to the data transmitted to the fifth latch LAT5.

After the first program voltage Vpgm1 is applied to the selected word line Sel_WL for a certain time, the page sensing signal PBSENSE may be changed to the low logic level L.

At time C7, all lines may be discharged to perform a next verify operation.

Figure 13:
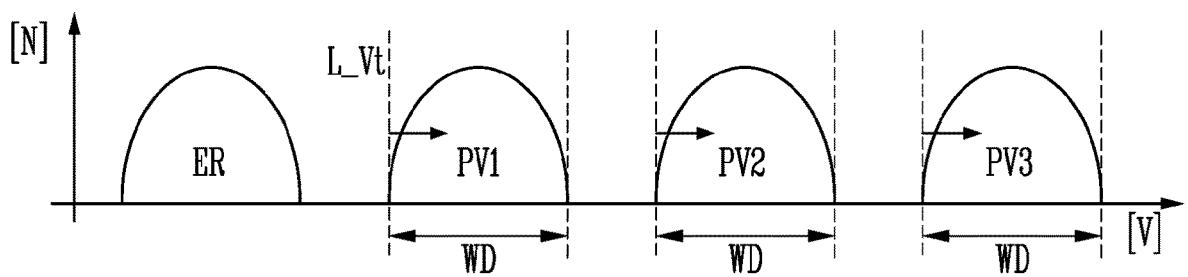
FIGS. 13 to 15 are diagrams illustrating threshold voltage distributions of memory cells.
Figure 14:
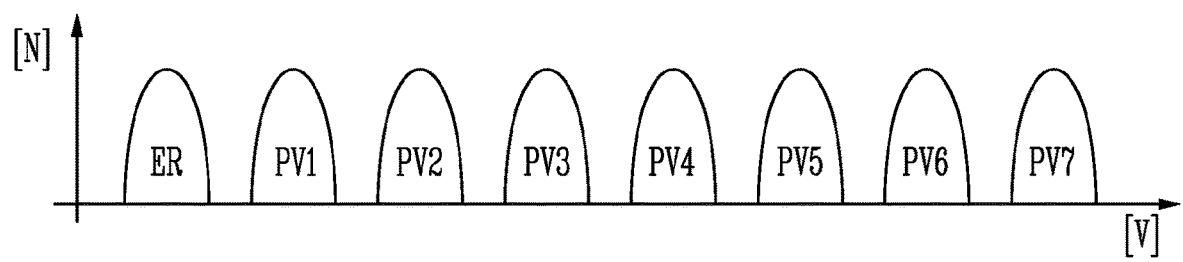
Figure 15:
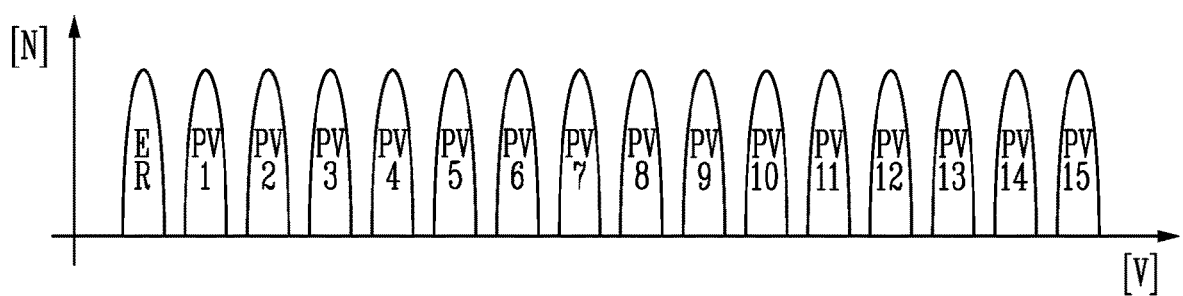

FIGS. 13 to 15 are diagrams illustrating threshold voltage distributions of memory cells.

FIG. 13 illustrates threshold voltage distributions of Multi-Level Cells (MLCs) each capable of storing 2-bit data. Referring to FIG. 13, memory cells programmed using an MLC method may be programmed in one program state among an erase state ER and first to third program states PV1 to PV3. In the above-described first to fifth embodiments, a relatively low threshold voltage L_vt is increased in each threshold voltage distribution, so that a width WD of the threshold voltage distribution can be narrowed.

FIG. 14 illustrates threshold voltage distributions of Triple Level Cells (TLCs) each capable of storing 3-bit data. Memory cells may be programmed in one program state among an erase state ER and first to seventh program states PV1 to PV7.

FIG. 15 illustrates threshold voltage distributions of Quadruple Level Cells (QLCs) each capable of storing 4-bit data. Memory cells may be programmed in one program state among an erase state ER and first to fifteenth program states PV1 to PV15.

The above-described first to fifth embodiments may be applied to memory devices driven using TLC and QLC methods as shown in FIGS. 14 and 15, and be applied to memory devices using methods higher than the QLC method. That is, a number of threshold voltage distributions increases as a number of bits to be stored in one memory cell increases. In accordance with this embodiment, the width of the threshold voltage can be narrowed, so that the reliability of the memory device can be improved even when the number of threshold voltage distributions increases.

Figure 16:
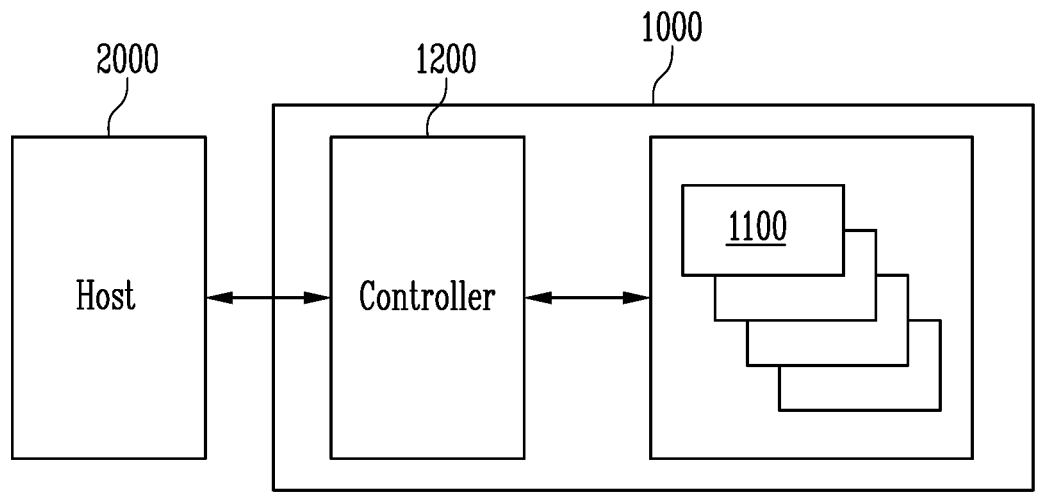
FIG. 16 is a diagram illustrating an embodiment of a memory system including the memory device shown in FIG. 1.

FIG. 16 is a diagram illustrating an embodiment of a memory system 1000 including the memory device 1100 shown in FIG. 1.

Referring to FIG. 16, the memory system 1000 may include the memory device 1100 configured to store data and a controller 1200 configured to communicate between the memory device 1100 and a host 2000.

A plurality of memory devices may be included in the memory system 1000, each of the memory devices may perform a program operation in accordance with one of the above-described first to fifth embodiments. The memory devices may be connected to the controller 1200 through at least one channel. For example, the plurality of memory devices may be connected to one channel. Even when a plurality of channels are connected to the controller 1200, the plurality of memory devices may be connected to the respective channels.

The controller 1200 may communicate between the host 2000 and the memory device 1100. The controller 1200 may control the memory device 1100 in response to a request from the host 2000, or perform a background operation for improving the performance of the memory system 1000. The host 2000 may generate requests for various operations, and output the generated requests to the memory system 1000. For example, the requests may include a program request capable of controlling a program operation, a read request capable of controlling a read operation, an erase request capable of controlling an erase operation, and the like.

The host 2000 may communicate with the memory system 1000 through various interfaces such as Peripheral Component Interconnect-Express (PCI-E), Advanced Technology Attachment (ATA), Serial ATA (SATA), Parallel ATA (PATA), Serial Attached SCSI (SAS), or Non-Volatile Memory Express (NVMe), a Universal Serial Bus (USB), a Multi-Media Card (MMC), an Enhanced Small Disk Interface (ESDI), and Integrated Drive Electronics (IDE).

Figure 17:
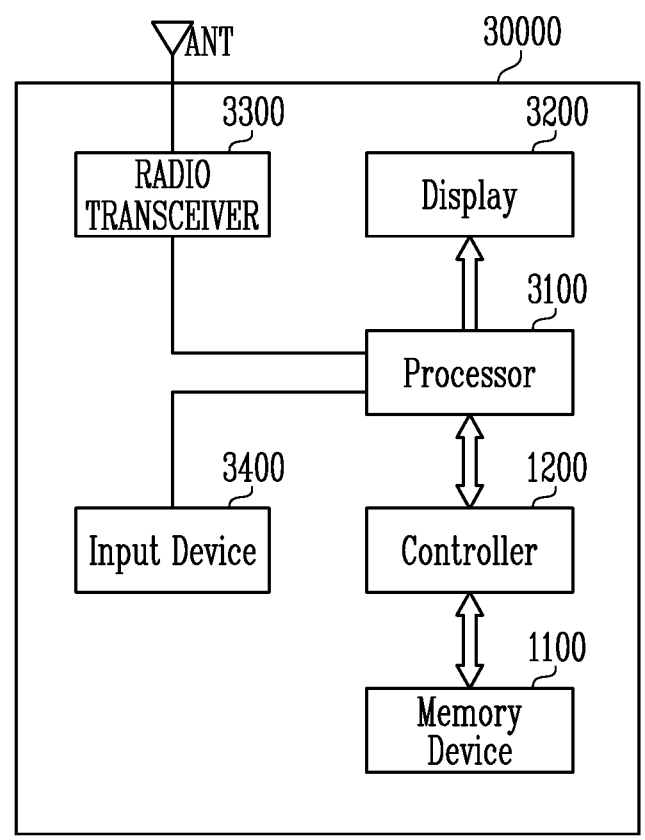
FIG. 17 is a diagram illustrating another embodiment of the memory system including the memory device shown in FIG. 1.

FIG. 17 is a diagram illustrating another embodiment of the memory system 30000 including the memory device 1100 shown in FIG. 1.

Referring to FIG. 17, the memory system 30000 may be implemented as a cellular phone, a smart phone, a tablet PC, a personal digital assistant (PDA), or a wireless communication device. The memory system 30000 may include a memory device 1100 and a controller 1200 capable of controlling an operation of the memory device 1100. The controller 1200 may control a data access operation of the memory device 1100, e.g., a program operation, an erase operation, a read operation, or the like under the control of a processor 3100.

The memory device 1100 may perform a program operation corresponding to one of the above-described first to fifth embodiments. Data programmed in the memory device 1100 may be output through a display 3200 under the control of the controller 1200.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the controller 1200 or the display 3200. The controller 1200 may transmit the signal processed by the processor 3100 to the memory device 1100. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad, a computer mouse, a keypad, or a keyboard. The processor 3100 may control an operation of the display 3200 such that data output from the controller 1200, data output from the radio transceiver 3300, or data output from the input device 3400 can be output through the display 3200.

In some embodiments, the controller 1200 capable of controlling an operation of the memory device 1100 may be implemented as a part of the processor 3100, or be implemented as a chip separate from the processor 3100.

Figure 18:
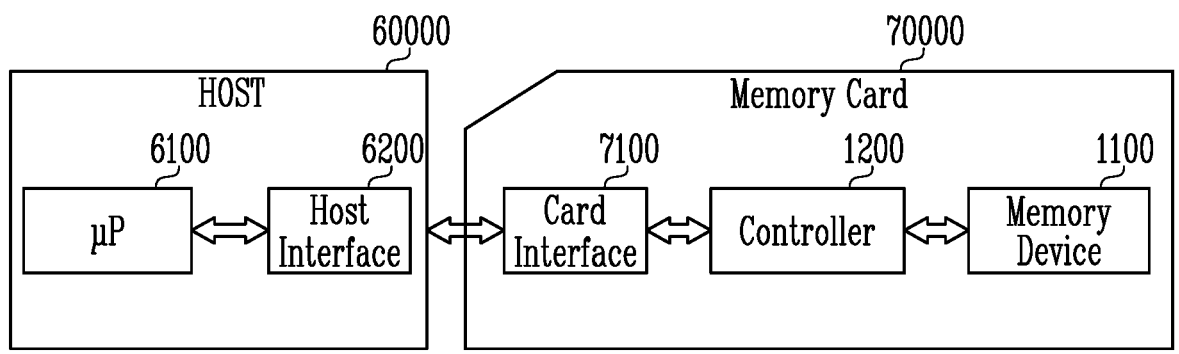
FIG. 18 is a diagram illustrating still another embodiment of the memory system including the memory device shown in FIG. 1.

FIG. 18 is a diagram illustrating another embodiment of the memory system 70000 including the memory device 1100 shown in FIG. 1.

Referring to FIG. 18, the memory system 70000 may be implemented as a memory card or a smart card. The memory system 70000 may include a memory device 1100, a controller 1200, and a card interface 7100.

The controller 1200 may control data exchange between the memory device 1100 and the card interface 7100. In some embodiments, the card interface 7100 may be a secure digital (SD) card interface or a multi-media card (MMC) interface, however, the present disclosure is not limited thereto.

The memory device 1100 may perform a program operation corresponding to one of the above-described first to fifth embodiments. Data programmed in the memory device 1100 may be output through the card interface 7100 under the control of the controller 1200.

The card interface 7100 may interface data exchange between the host 60000 and the controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

In accordance with the present disclosure, the width of a threshold voltage distribution of memory cells can be narrowed without any increase in size of the memory device, so that the reliability of the memory device can be improved.

What is claimed is:

1. A memory device comprising:
   memory cells connected between a bit line and a source line;
   a voltage generator configured to generate verify voltages;
   a page buffer configured to store data indicating that a state of a selected memory cell from among the memory cells is one of a plurality of states defined by the verify voltages based on the verify voltages and a threshold voltage of the selected memory cell; and
   a logic circuit configured to:
   control, based on the state of the memory cell indicated by the data, the page buffer to apply a program allow voltage, a program inhibit voltage, or a program control voltage to the bit line, and
   adjust, when the state of the selected memory cell is one of states corresponding to the program control voltage included in the plurality of states, a time to apply the program control voltage according to the state of the memory cell.

2. The memory device of claim 1, wherein the page buffer includes:
   a plurality of input latches configured to store the data respectively sensed in verify operations using the verify voltages;
   an output latch configured to sequentially receive data from the input latches;
   a precharge circuit configured to precharge the bit line to a positive voltage according to data stored in the output latch; and
   a discharge circuit configured to discharge the bit line according to data stored in the output latch.

3. The memory device of claim 2, wherein, in a program operation, the plurality of input latches sequentially transmit the stored data to the output latch.

4. The memory device of claim 3, wherein the plurality of input latches:
   transmit, to the output latch, data sensed by a higher verify voltage among the verify voltages; and
   subsequently transmit, to the output latch, data sensed by a lower verify voltage among the verify voltages, after a certain time elapses after previous data is transmitted.

5. The memory device of claim 2, wherein the precharge circuit is connected between a node and a power supply voltage terminal, and
   wherein the discharge circuit is connected between the node and a ground terminal.

6. The memory device of claim 5, further comprising a switch connected between the node and the bit line, and controlled according to a page sensing signal.

7. The memory device of claim 6, wherein a turn-on level of the switch varies depending on a level of the page sensing signal.

8. The memory device of claim 7, wherein, when the level of the page sensing signal is a high voltage, the program allow voltage or the program inhibit voltage is applied to the bit line,
   wherein, when the level of the page sensing signal is a sensing voltage having a positive voltage, which is lower than the high voltage, the program allow voltage or the program control voltage is applied to the bit line.

9. The memory device of claim 7, wherein the voltage generator outputs the program voltage having a constant level to the selected word line while the plurality of input latches are sequentially transmitting the data to the output latch,
   wherein, while the program voltage having the constant level is output, the logic circuit steps down the level of the page sensing signal according to a time for which the data are transmitted.

10. The memory device of claim 7, wherein the voltage generator outputs, to the selected word line, the program voltage having levels increased in stages when the plurality of input latches are sequentially transmitting the data to the output latch,
    wherein, while the program voltage having levels increased in stages is output, the logic circuit constantly maintains the page sensing signal at the level of the sensing voltage.

11. The memory device of claim 2, wherein the voltage generator outputs the program voltage having a constant level to the selected word line while the plurality of input latches are sequentially transmitting the data to the output latch.

12. The memory device of claim 7, wherein the plurality of input latches:
    simultaneously transmit, to the output latch, data sensed by the other verify voltages except data sensed by a lowest verify voltage among the verify voltages; and
    transmit the data sensed by the lowest verify voltage to the output latch, after the data are simultaneously transmitted to the output latch.

13. The memory device of claim 12, wherein the voltage generator steps down the level of the program voltage, and
    wherein, while the program voltage is stepping down, the logic circuit constantly maintains the page sensing signal at a level of a sensing voltage.

14. A method for operating a memory device, the method comprising:
    performing verify operations on a memory cell using a plurality of verify voltages, respectively;
    applying a program voltage to a selected word line connected to the memory cell;
    applying, while the program voltage is applied, a program allow voltage, a program inhibit voltage, or a program control voltage to a bit line connected to the memory cell based on a state of the memory cell from among a plurality of states defined by the plurality of verify voltages; and
    adjusting, when the state of the memory cell is one of states corresponding to the program control voltage included in the plurality of states, a time to apply the program control voltage according to the state of the memory cell.

15. The method of claim 14, wherein the plurality of verify voltages are used to determine the state of the memory cell according to a threshold voltage of the memory cell to be programmed to a target voltage.

16. The method of claim 14, wherein, while the program allow voltage, the program inhibit voltage or the program control voltage is applied to the bit line, the program voltage is constantly maintained.

17. The method of claim 14, wherein, while the program allow voltage, the program inhibit voltage or the program control voltage is applied to the bit line, the program voltage is stepped down.

18. The method of claim 14, wherein, while the program allow voltage, the program inhibit voltage or the program control voltage is applied to the bit line, the program voltage is stepped up.

19. A method for operating a memory device, the method comprising:

programming a memory cell to increase a threshold voltage of the memory cell to a target voltage;

verifying the memory cell by using a plurality of verify voltages; and performing a program operation by controlling a voltage applied to a bit line connected to the memory cell until the threshold voltage of the verified memory cell is increased up to the target voltage, the voltage comprising one of a program allow voltage, a program inhibit voltage, and a program control voltage, wherein the controlling the voltage comprises:

controlling, when the voltage is the program control voltage, a time to apply the voltage to the bit line based on a state of the memory cell from among a plurality of states sensed in a verify operation using the plurality of verify voltages, and sequentially controlling a level of a page sensing signal applied to a switch which connects the bit line and a page buffer.

20. A method for operating a memory device, the method comprising:

programming a memory cell to increase a threshold voltage of the memory cell to a target voltage;

verifying the memory cell by using a plurality of verify voltages; and performing a program operation by controlling a voltage applied to a bit line connected to the memory cell until the threshold voltage of the verified memory cell is increased up to the target voltage, the voltage comprising one of a program allow voltage, a program inhibit voltage, and a program control voltage, wherein the controlling the voltage comprises:

controlling, when the voltage is the program control voltage, a time to apply the voltage to the bit line based on a state of the memory cell from among a plurality of states sensed in a verify operation using the plurality of verify voltages, and controlling a level of a page sensing signal applied to a switch which connects the bit line and a page buffer depending on the controlled time.

* * * * *